(12) United States Patent
Andersson et al.

(10) Patent No.: US 10,892,781 B2
(45) Date of Patent: Jan. 12, 2021

(54) METHOD AND DEVICES FOR A REDUCED REPAIR AND UPDATE ERASURE CODE

(71) Applicant: ZEBWARE AB, Stockholm (SE)

(72) Inventors: Johan Andersson, Stockholm (SE); Thomas Nilsson, Meilen (CH)

(73) Assignee: ZEBWARE AB, Stockholm (SE)

(*) Notice: Subject to any disclaimer, the term of this patent is extended or adjusted under 35 U.S.C. 154(b) by 12 days.

(21) Appl. No.: 16/185,692

(22) Filed: Nov. 9, 2018

(65) Prior Publication Data

US 2019/0158120 A1 May 23, 2019

Related U.S. Application Data

(60) Provisional application No. 62/588,578, filed on Nov. 20, 2017.

(51) Int. Cl.
*H03M 13/00* (2006.01)
*H03M 13/15* (2006.01)
(Continued)

(52) U.S. Cl.
CPC ...... *H03M 13/1525* (2013.01); *H04L 1/0041* (2013.01); *H04L 1/0045* (2013.01); *H04L 1/0057* (2013.01); *H04L 67/1097* (2013.01)

(58) Field of Classification Search
CPC ........... H03M 13/1525; H03M 13/373; H03M 13/07; H03M 13/27; H03M 13/293;
(Continued)

(56) References Cited

U.S. PATENT DOCUMENTS 9,122,952 B2 * 9/2015 Silver .................. G06K 7/1413
10,523,244 B2 * 12/2019 Nilsson ................. H03M 13/27
(Continued)

FOREIGN PATENT DOCUMENTS

WO  WO 2015/055450 A1  4/2015
WO  WO 2015/145078 A2  10/2015
WO  WO 2017/023199 A1  2/2017

OTHER PUBLICATIONS

Implicit effect of decoding time on fault tolerance in erasure coded Cloud Storage systems Computer Science and Engineering Conference (ICSEC), International (Year: 2016).*

(Continued)

*Primary Examiner* — Albert Decady
*Assistant Examiner* — Enamul M Kabir
(74) *Attorney, Agent, or Firm* — Oblon, McClelland, Maier & Neustadt, L.L.P.

(57) ABSTRACT

An apparatus for generating encoded data includes processing circuitry configured to encode data using a Mojette transform (MT) based on generating encoded representations of data blocks. Generating the encoded representations of data blocks includes reading data in the form of a data block formatted according to specified settings to comprise rows and columns, creating a set of projections, and outputting the created set of projections to enable storage of the data in the form of the set of projections. The apparatus then transmits the encoded data over a network to another device. Additionally, creating the set of projections includes applying the Mojette transform on the data block, and creating a first number of projections based on mapping each row of the data block to a corresponding projection, wherein the first number of projections carries the same information as a corresponding row.

26 Claims, 21 Drawing Sheets

(51) Int. Cl.
*H04L 1/00* (2006.01)
*H04L 29/08* (2006.01)
(58) Field of Classification Search
CPC ......... H03M 13/2906; H03M 13/2942; H03M 13/3761; H04L 1/0041; H04L 1/0045; H04L 1/0057; H04L 67/1097
USPC ....................................................... 714/776
See application file for complete search history.

(56) References Cited

U.S. PATENT DOCUMENTS

| | | | | |
|---|---|---|---|---|
| 2011/0129090 | A1* | 6/2011 | Grall | H04W 12/0401 380/285 |
| 2016/0254826 | A1* | 9/2016 | David | H04L 1/0043 714/758 |
| 2018/0054217 | A1* | 2/2018 | Schwaderer | H03M 13/15 |

OTHER PUBLICATIONS

Khan, O., et al., "Rethinking Erasure Codes for Cloud File Systems: Minimizing I/O for Recovery and Degraded Reads", File and Storage Technologies, Retrieved from the Internet: https://www.usenix.org/system/files/conference/fast12/khan.pdf, 2012, 14 pages.

Huang, C., et al., "Pyramid Codes: Flexible Schemes to Trade Space for Access Efficiency in Reliable Data Storage Systems", IEEE NCA, Jul. 2007, 19 pages.

Arslan, S.S., et al., "Mojette Transform based LDPC Erasure Correction Codes for Distributed Storage Systems", ResearchGate, Retrieved from the Internet: https://www.researchgate.net/publication/316890171 , May 2017, pp. 1-10 with cover page.

"Intel® Intelligent Storage Acceleration Library (Intel® ISA-L) Open Source Version", API Reference Manual—Version 2.8, Sep. 27, 2013, 25 pages.

Panzer-Steindel, B., "Data Integrity", Cern/ IT, Apr. 8, 2007, pp. 1-7.

Just, S., "Erasure Coding and Cache Tiering", 2015, CEPH, Vault, 88 pages.

Verbert, P., et al., "Analysis of Mojette Transform Projections for an Efficient Coding", Workshop on Image Analysis for Multimedia Interactive Services, Apr. 2004, 5 pages.

Bairavasundaram, L. N., "An Analysis of Data Corruption in the Storage Stack", USENIX Association, Fast '08: 6$^{th}$ USENIX Conference on File and Storage Technologies, pp. 223-238.

* cited by examiner

|   | k |   |   |   |   |   |   |   |   | lr | m1 | m2 |
|---|---|---|---|---|---|---|---|---|---|----|----|----|
| 1 |   |   |   |   |   |   |   |   |   |    |    |    |
| 2 |   |   |   |   |   |   |   |   |   |    |    |    |
| 3 |   |   |   |   |   |   |   |   |   |    |    |    |
| 4 |   |   |   |   |   |   |   |   |   |    |    |    |
| 5 |   |   |   |   |   |   |   |   |   |    |    |    |
| 6 |   |   |   |   |   |   |   |   |   |    |    |    |
| 7 |   |   |   |   |   |   |   |   |   |    |    |    |
| 8 |   |   |   |   |   |   |   |   |   |    |    |    |

Fig 2a

| 1 |   |   |   |   |   |   |   |   |   |
|---|---|---|---|---|---|---|---|---|---|
| 2 |   |   |   |   |   |   |   |   |   |
| 3 |   |   |   |   |   |   |   |   |   |
| 4 |   |   |   |   |   |   |   |   |   |
| 5 |   |   |   |   |   |   |   |   |   |
| 6 |   |   |   |   |   |   |   |   |   |
| 7 |   |   |   |   |   |   |   |   |   |
| 8 |   |   |   |   |   |   |   |   |   |

Fig 2b

| 1 | 1  | 2  | 3  | 4  | 5  | 6  | 7  | 8  | 9  | 10 |
|---|----|----|----|----|----|----|----|----|----|----|
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5 | 41 | 42 | 43 | 44 | 45 | 46 | 47 | 48 | 49 | 50 |
| 6 | 51 | 52 | 53 | 54 | 55 | 56 | 57 | 58 | 59 | 60 |
| 7 | 61 | 62 | 63 | 64 | 65 | 66 | 67 | 68 | 69 | 70 |
| 8 | 71 | 72 | 73 | 74 | 75 | 76 | 77 | 78 | 79 | 80 |

Fig 2c p(1,1)

| | 1 | 2 | 3 | 4 | 5 | 6 | 7 | 8 | 9 | 10 | | | | | | |
|---|---|---|---|---|---|---|---|---|---|---|---|---|---|---|---|---|
| 1 | 1 | 2 | 3 | 4 | 5 | 6 | 7 | 8 | 9 | 10 | | | | | | |
| 2 | | 11 | 12 | 13 | 14 | 15 | 16 | 17 | 18 | 19 | 20 | | | | | |
| 3 | | | 21 | 22 | 23 | 24 | 25 | 26 | 27 | 28 | 29 | 30 | | | | |
| 4 | | | | 31 | 32 | 33 | 34 | 35 | 36 | 37 | 38 | 39 | 40 | | | |
| 5 | | | | | 41 | 42 | 43 | 44 | 45 | 46 | 47 | 48 | 49 | 50 | | |
| 6 | | | | | | 51 | 52 | 53 | 54 | 55 | 56 | 57 | 58 | 59 | 60 | |
| 7 | | | | | | | 61 | 62 | 63 | 64 | 65 | 66 | 67 | 68 | 69 | 70 |
| 8 | | | | | | | | 71 | 72 | 73 | 74 | 75 | 76 | 77 | 78 | 79 | 80 |
| BINS | 1 | 13 | 36 | 70 | 115 | 171 | 238 | 316 | 324 | 332 | 329 | 315 | 290 | 254 | 207 | 149 | 80 |

Fig 3a p(-1,1)

| | | | | | | | 1 | 2 | 3 | 4 | 5 | 6 | 7 | 8 | 9 | 10 |
|---|---|---|---|---|---|---|---|---|---|---|---|---|---|---|---|---|
| 1 | | | | | | | 1 | 2 | 3 | 4 | 5 | 6 | 7 | 8 | 9 | 10 |
| 2 | | | | | | 11 | 12 | 13 | 14 | 15 | 16 | 17 | 18 | 19 | 20 | |
| 3 | | | | | 21 | 22 | 23 | 24 | 25 | 26 | 27 | 28 | 29 | 30 | | |
| 4 | | | | 31 | 32 | 33 | 34 | 35 | 36 | 37 | 38 | 39 | 40 | | | |
| 5 | | | 41 | 42 | 43 | 44 | 45 | 46 | 47 | 48 | 49 | 50 | | | | |
| 6 | | 51 | 52 | 53 | 54 | 55 | 56 | 57 | 58 | 59 | 60 | | | | | |
| 7 | 61 | 62 | 63 | 64 | 65 | 66 | 67 | 68 | 69 | 70 | | | | | | |
| 8 | 71 | 72 | 73 | 74 | 75 | 76 | 77 | 78 | 79 | 80 | | | | | | |
| BINS | 71 | 133 | 186 | 230 | 265 | 291 | 308 | 316 | 324 | 332 | 259 | 195 | 140 | 94 | 57 | 29 | 10 |

Fig 3b $Lr_{1,1}(2,1)$       $Lr_{1,2}(2,1)$

| | 1 | 2 | 3 | 4 | 5 | 6 | 7 | 8 | 9 | 10 | | | | | | | | | | | | | | | |
|---|---|---|---|---|---|---|---|---|---|---|---|---|---|---|---|---|---|---|---|---|---|---|---|---|---|
| 1 | 1 | 2 | 3 | 4 | 5 | 6 | 7 | 8 | 9 | 10 | | | | | | | | | | | | | | | |
| 2 | | 11 | 12 | 13 | 14 | 15 | 16 | 17 | 18 | 19 | 20 | | | | | | | | | | | | | | |
| 3 | | | 21 | 22 | 23 | 24 | 25 | 26 | 27 | 28 | 29 | 30 | | | | | | | | | | | | | |
| 4 | | | | 31 | 32 | 33 | 34 | 35 | 36 | 37 | 38 | 39 | 40 | | | | | | | | | | | | |
| 5 | | | | | | | | | | | | | | 41 | 42 | 43 | 44 | 45 | 46 | 47 | 48 | 49 | 50 | | |
| 6 | | | | | | | | | | | | | | | 51 | 52 | 53 | 54 | 55 | 56 | 57 | 58 | 59 | 60 | |
| 7 | | | | | | | | | | | | | | | | 61 | 62 | 63 | 64 | 65 | 66 | 67 | 68 | 69 | 70 |
| 8 | | | | | | | | | | | | | | | | | 71 | 72 | 73 | 74 | 75 | 76 | 77 | 78 | 79 | 80 |
| BINS | 1 | 2 | 14 | 16 | 39 | 42 | 76 | 80 | 84 | 88 | 81 | 84 | 66 | 68 | 39 | 40 | 41 | 42 | 94 | 96 | 159 | 162 | 236 | 240 | 244 | 248 | 201 | 204 | 146 | 148 | 79 | 80 |

Fig 3c

|   | 1 | 2 | 3 | 4 | 5 | 6 | 7 | 8 | 9 | 10 |
|---|---|---|---|---|---|---|---|---|---|---|
| 1 | 1 | 2 | 3 | 4 | 5 | 6 | 7 | 8 | 9 | 10 |
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5 | 41 | 42 | 43 | 44 | 45 | 46 | 47 | 48 | 49 | 50 |
| 6 |   |   |   |   |   |   |   |   |   |   |
| 7 |   |   |   |   |   |   |   |   |   |   |
| 8 | 71 | 72 | 73 | 74 | 75 | 76 | 77 | 78 | 79 | 80 |

Fig 4a $p(-1,1)$

| | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 1 | | | | | | 1 | 2 | 3 | 4 | 5 | 6 | 7 | 8 | 9 | 10 |
| 2 | | | | | 11 | 12 | 13 | 14 | 15 | 16 | 17 | 18 | 19 | 20 | |
| 3 | | | | 21 | 22 | 23 | 24 | 25 | 26 | 27 | 28 | 29 | 30 | | |
| 4 | | | 31 | 32 | 33 | 34 | 35 | 36 | 37 | 38 | 39 | 40 | | | |
| 5 | | 41 | 42 | 43 | 44 | 45 | 46 | 47 | 48 | 49 | 50 | | | | |
| 6## | 51 | 52 | 53 | 54 | 55 | 56 | 57 | 58 | 59 | 60 | | | | | |
| 7## | 61 | 62 | 63 | 64 | 65 | 66 | 67 | 68 | 69 | 70 | | | | | |
| 8 | 71 | 72 | 73 | 74 | 75 | 76 | 77 | 78 | 79 | 80 | | | | | |
| BINS | 71 | 133 | 186 | 230 | 291 | 308 | 316 | 324 | 332 | 259 | 195 | 140 | 94 | 57 | 29 | 10 |

| 1 | 1 | 2 | 3 | 4 | 5 | 6 | 7 | 8 | 9 | 10 |
|---|---|---|---|---|---|---|---|---|---|---|
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5 | 41 | 42 | 43 | 44 | 45 | 46 | 47 | 48 | 49 | 50 |
| 6 | 51 | 52 |   |   |   |   |   | 58 | 59 | 60 |
| 7 | 61 | 62 | 63 |   |   |   |   |   | 69 | 70 |
| 8 | 71 | 72 | 73 | 74 | 75 | 76 | 77 | 78 | 79 | 80 |
Fig 4d
$Lr_{1,2}(2,1)$
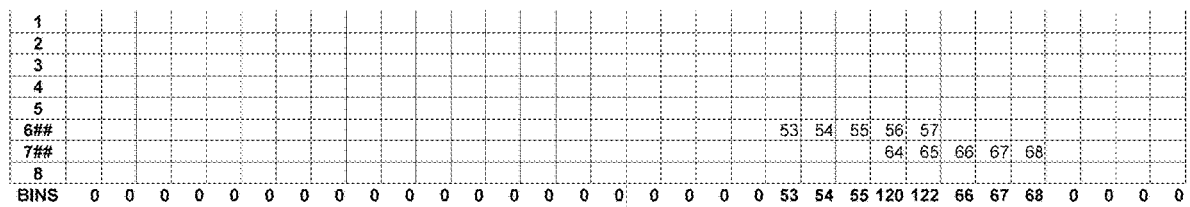
Fig 4e
| 1 | 1 | 2 | 3 | 4 | 5 | 6 | 7 | 8 | 9 | 10 |
|---|---|---|---|---|---|---|---|---|---|---|
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5 | 41 | 42 | 43 | 44 | 45 | 46 | 47 | 48 | 49 | 50 |
| 6 | 51 | 52 | 53 | 54 | 55 |   |   | 58 | 59 | 60 |
| 7 | 61 | 62 | 63 |   |   | 66 | 67 | 68 | 69 | 70 |
| 8 | 71 | 72 | 73 | 74 | 75 | 76 | 77 | 78 | 79 | 80 |
Fig 4f
$p(-1,1)$
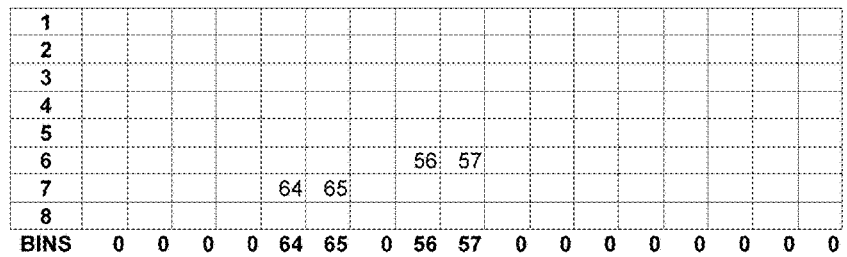
Fig 4g

| 1 | 1 | 2 | 3 | 4 | 5 | 6 | 7 | 8 | 9 | 10 |
|---|---|---|---|---|---|---|---|---|---|---|
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5 | 41 | 42 | 43 | 44 | 45 | 46 | 47 | 48 | 49 | 50 |
| 6 | 51 | 52 | 53 | 54 | 55 | 56 | 57 | 58 | 59 | 60 |
| 7 | 61 | 62 | 63 | 64 | 65 | 66 | 67 | 68 | 69 | 70 |
| 8 | 71 | 72 | 73 | 74 | 75 | 76 | 77 | 78 | 79 | 80 |

Fig 4h

| | | | | | | | | | | |
|---|---|---|---|---|---|---|---|---|---|---|
| 1 | 1 | 2 | 3 | 4 | 5 | 6 | 7 | 8 | 9 | 10 |
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5 | 41 | 42 | 43 | 44 | 45 | 46 | 47 | 48 | 49 | 50 |
| 6 | 51 | 52 | 53 | 54 | 55 | 56 | 57 | 58 | 59 | 60 |
| 7 | 61 | 62 | 63 | 64 | 65 | 66 | 67 | 68 | 69 | 70 |
| 8 | 71 | 72 | 73 | 74 | 75 | 76 | 77 | 78 | 79 | 80 |

| | | | | | | | | | | | | | | | | | |
|---|---|---|---|---|---|---|---|---|---|---|---|---|---|---|---|---|---|
| 1 | 1 | 2 | 3 | 4 | 5 | 6 | 7 | 8 | 9 | 10 | | | | | | | |
| 2 | | 11 | 12 | 13 | 14 | 15 | 16 | 17 | 18 | 19 | 20 | | | | | | |
| 3 | | | 21 | 22 | 23 | 24 | 25 | 26 | 27 | 28 | 29 | 30 | | | | | |
| 4 | | | | 31 | 32 | 33 | 34 | 35 | 36 | 37 | 38 | 39 | 40 | | | | |
| 5 | | | | | 41 | 42 | 43 | 44 | 45 | 46 | 47 | 48 | 49 | 50 | | | |
| 6 | | | | | | 51 | 52 | 53 | 54 | 55 | 56 | 57 | 58 | 59 | 60 | | |
| 7 | | | | | | | 61 | 62 | 63 | 64 | 65 | 66 | 67 | 68 | 69 | 70 | |
| 8 | | | | | | | 71 | 72 | 73 | 74 | 75 | 76 | 77 | 78 | 79 | 80 |
| BINS | 1 | 13 | 36 | 70 | 115 | 171 | 238 | 316 | 324 | 332 | 329 | 315 | 290 | 254 | 207 | 149 | 80 |

| | | | | | | | | | | | | | | | | | |
|---|---|---|---|---|---|---|---|---|---|---|---|---|---|---|---|---|---|
| 1 | | | | | | | 1 | 2 | 3 | 4 | 5 | 6 | 7 | 8 | 9 | 10 | |
| 2 | | | | | | 11 | 12 | 13 | 14 | 15 | 16 | 17 | 18 | 19 | 20 | | |
| 3 | | | | | 21 | 22 | 23 | 24 | 25 | 26 | 27 | 28 | 29 | 30 | | | |
| 4 | | | | 31 | 32 | 33 | 34 | 35 | 36 | 37 | 38 | 39 | 40 | | | | |
| 5 | | | 41 | 42 | 43 | 44 | 45 | 46 | 47 | 48 | 49 | 50 | | | | | |
| 6 | | 51 | 52 | 53 | 54 | 55 | 56 | 57 | 58 | 59 | 60 | | | | | | |
| 7 | 61 | 62 | 63 | 64 | 65 | 66 | 67 | 68 | 69 | 70 | | | | | | | |
| 8 | 71 | 72 | 73 | 74 | 75 | 76 | 77 | 78 | 79 | 80 | | | | | | | |
| BINS | 71 | 133 | 186 | 230 | 265 | 291 | 308 | 316 | 324 | 332 | 259 | 195 | 140 | 94 | 57 | 29 | 10 |

Fig 5c

| | | | | | | | | | | |
|---|---|---|---|---|---|---|---|---|---|---|
| 1 | 1 | 2 | 3 | 4 | 5 | 6 | 7 | 8 | 9 | 10 |
| 2 | 11 | 12 | 13 | 14 | 15 | 16 | 17 | 18 | 19 | 20 |
| 3 | 21 | 22 | 23 | 24 | 25 | 26 | 27 | 28 | 29 | 30 |
| 4 | 31 | 32 | 33 | 34 | 35 | 36 | 37 | 38 | 39 | 40 |
| 5# | | | | | | | | | | |
| 6 | 51 | 52 | 53 | 54 | 55 | 56 | 57 | 58 | 59 | 60 |
| 7 | 61 | 62 | 63 | 64 | 65 | 66 | 67 | 68 | 69 | 70 |
| 8 | 71 | 72 | 73 | 74 | 75 | 76 | 77 | 78 | 79 | 80 |

Fig 5d

| | | | | | | | | | | | | | | | | | |
|---|---|---|---|---|---|---|---|---|---|---|---|---|---|---|---|---|---|
| 1 | | 1 | 2 | 3 | 4 | 5 | 6 | 7 | 8 | 9 | 10 | | | | | | |
| 2 | | | 11 | 12 | 13 | 14 | 15 | 16 | 17 | 18 | 19 | 20 | | | | | |
| 3 | | | | 21 | 22 | 23 | 24 | 25 | 26 | 27 | 28 | 29 | 30 | | | | |
| 4 | | | | | 31 | 32 | 33 | 34 | 35 | 36 | 37 | 38 | 39 | 40 | | | |
| 5# | | | | | | | | | | | | | | | | | |
| 6 | | | | | | | 51 | 52 | 53 | 54 | 55 | 56 | 57 | 58 | 59 | 60 | |
| 7 | | | | | | | | 61 | 62 | 63 | 64 | 65 | 66 | 67 | 68 | 69 | 70 |
| 8 | | | | | | | | | 71 | 72 | 73 | 74 | 75 | 76 | 77 | 78 | 79 | 80 |
| BINS | | 1 | 13 | 36 | 70 | 74 | 129 | 195 | 272 | 279 | 286 | 282 | 267 | 241 | 204 | 207 | 149 | 80 |

Fig 5e

| | | | | | | | | | | | | | | | | | |
|---|---|---|---|---|---|---|---|---|---|---|---|---|---|---|---|---|---|
| BINS P1 | 1 | 13 | 36 | 70 | 115 | 171 | 238 | 316 | 324 | 332 | 329 | 315 | 290 | 254 | 207 | 149 | 80 |
| Partial_BINS_X5_P1 | 1 | 13 | 36 | 70 | 74 | 129 | 195 | 272 | 279 | 286 | 282 | 267 | 241 | 204 | 207 | 149 | 80 |
| Chunk 5 (row 5) | 0 | 0 | 0 | 0 | 41 | 42 | 43 | 44 | 45 | 46 | 47 | 48 | 49 | 50 | 0 | 0 | 0 |

Fig 5f

| | | 1 | 2 | 3 | 4 | 5 | 6 | 7 | 8 | 9 | 10 | | | | | | |
|---|---|---|---|---|---|---|---|---|---|---|---|---|---|---|---|---|---|
| 1 | | 1 | 2 | 3 | 4 | 5 | 6 | 7 | 8 | 9 | 10 | | | | | | |
| 2 | | | 11 | 12 | 13 | 14 | 15 | 16 | 17 | 18 | 19 | 20 | | | | | |
| 3 | | | | | | | | | | | | | | | | | |
| 4 | | | | | | | | | | | | | | | | | |
| 5 | | | | | | | | | | | | | | | | | |
| 6 | | | | | | | | | | | | | | | | | |
| 7 | | | | | | | | | | | | | | | | | |
| 8 | | | | | | | | | | | | | | | | | |
| BINS12 | 1 | 13 | 15 | 17 | 19 | 21 | 23 | 25 | 27 | 29 | 20 | 0 | 0 | 0 | 0 | 0 | 0 |

| | | | | | | | | | | | | | | | | | |
|---|---|---|---|---|---|---|---|---|---|---|---|---|---|---|---|---|---|
| 1 | | | | | | | | | | | | | | | | | |
| 2 | | | | | | | | | | | | | | | | | |
| 3 | | | 21 | 22 | 23 | 24 | 25 | 26 | 27 | 28 | 29 | 30 | | | | | |
| 4 | | | | 31 | 32 | 33 | 34 | 35 | 36 | 37 | 38 | 39 | 40 | | | | |
| 5 | | | | | | | | | | | | | | | | | |
| 6 | | | | | | | | | | | | | | | | | |
| 7 | | | | | | | | | | | | | | | | | |
| 8 | | | | | | | | | | | | | | | | | |
| BINS34 | 0 | 0 | 21 | 53 | 55 | 57 | 59 | 61 | 63 | 65 | 67 | 69 | 40 | 0 | 0 | 0 | 0 |

| | | | | | | | | | | | | | | | | | |
|---|---|---|---|---|---|---|---|---|---|---|---|---|---|---|---|---|---|
| 1 | | | | | | | | | | | | | | | | | |
| 2 | | | | | | | | | | | | | | | | | |
| 3 | | | | | | | | | | | | | | | | | |
| 4 | | | | | | | | | | | | | | | | | |
| 5 | | | | | | 41 | 42 | 43 | 44 | 45 | 46 | 47 | 48 | 49 | 50 | | |
| 6 | | | | | | | 51 | 52 | 53 | 54 | 55 | 56 | 57 | 58 | 59 | 60 | |
| 7 | | | | | | | | | | | | | | | | | |
| 8 | | | | | | | | | | | | | | | | | |
| BINS56 | 0 | 0 | 0 | 0 | 41 | 93 | 95 | 97 | 99 | 101 | 103 | 105 | 107 | 109 | 60 | 0 | 0 |

| | | | | | | | | | | | | | | | | | |
|---|---|---|---|---|---|---|---|---|---|---|---|---|---|---|---|---|---|
| 1 | | | | | | | | | | | | | | | | | |
| 2 | | | | | | | | | | | | | | | | | |
| 3 | | | | | | | | | | | | | | | | | |
| 4 | | | | | | | | | | | | | | | | | |
| 5 | | | | | | | | | | | | | | | | | |
| 6 | | | | | | | | | | | | | | | | | |
| 7## | | | | | | | | | | | | | | | | | |
| 8 | | | | | | | | | 71 | 72 | 73 | 74 | 75 | 76 | 77 | 78 | 79 | 80 |
| BINS7X8 | 0 | 0 | 0 | 0 | 0 | 0 | 0 | 71 | 72 | 73 | 74 | 75 | 76 | 77 | 78 | 79 | 80 |

Fig 6a

| 1 | 1 | 2 | 3 | 4 | 5 | 6 | 7 | 8 | 9 | 10 | | | | | |
|---|---|---|---|---|---|---|---|---|---|---|---|---|---|---|---|
| 2 | | 11 | 12 | 13 | 14 | 15 | 16 | 17 | 18 | 19 | 20 | | | | |
| 3 | | | 21 | 22 | 23 | 24 | 25 | 26 | 27 | 28 | 29 | 30 | | | |
| 4 | | | | 31 | 32 | 33 | 34 | 35 | 36 | 37 | 38 | 39 | 40 | | |
| 5 | | | | | 41 | 42 | 43 | 44 | 45 | 46 | 47 | 48 | 49 | 50 | |
| 6 | | | | | | 51 | 52 | 53 | 54 | 55 | 56 | 57 | 58 | 59 | 60 |
| 7 | | | | | | | 61 | 62 | 63 | 64 | 65 | 66 | 67 | 68 | 69 | 70 |
| 8 | | | | | | | | 71 | 72 | 73 | 74 | 75 | 76 | 77 | 78 | 79 | 80 |
| BINS P1 | 1 | 13 | 36 | 70 | 115 | 171 | 238 | 316 | 324 | 332 | 329 | 315 | 290 | 254 | 207 | 149 | 80 |

| P1 | BINS P1 | 1 | 13 | 36 | 70 | 115 | 171 | 238 | 316 | 324 | 332 | 329 | 315 | 290 | 254 | 207 | 149 | 80 |
|---|---|---|---|---|---|---|---|---|---|---|---|---|---|---|---|---|---|---|
| Part 12 | | 1 | 13 | 15 | 17 | 19 | 21 | 23 | 25 | 27 | 29 | 20 | 0 | 0 | 0 | 0 | 0 | 0 |
| Part 34 | | 0 | 0 | 21 | 53 | 55 | 57 | 59 | 61 | 63 | 65 | 67 | 69 | 40 | 0 | 0 | 0 | 0 |
| Part 56 | | 0 | 0 | 0 | 0 | 41 | 93 | 95 | 97 | 99 | 101 | 103 | 105 | 107 | 109 | 60 | 0 | 0 |
| Part 7#8 | | 0 | 0 | 0 | 0 | 0 | 0 | 0 | 71 | 72 | 73 | 74 | 75 | 76 | 77 | 78 | 79 | 80 |
| Row7 (Repaired) | | 0 | 0 | 0 | 0 | 0 | 0 | 61 | 62 | 63 | 64 | 65 | 66 | 67 | 68 | 69 | 70 | 0 |

P1

| | | | | | | | | | | | | | | | | |
|---|---|---|---|---|---|---|---|---|---|---|---|---|---|---|---|---|
| 1 | 1 | 2 | 3 | 4 | 5 | 6 | 7 | 8 | 9 | 10 | | | | | | |
| 2 | | 11 | 12 | 13 | 14 | 15 | 16 | 17 | 18 | 19 | 20 | | | | | |
| 3#P1 | | | 21 | 22 | 23 | 24 | 25 | 26 | 27 | 28 | 29 | 30 | | | | |
| 4 | | | | 31 | 32 | 33 | 34 | 35 | 36 | 37 | 38 | 39 | 40 | | | |
| 5 | | | | | 41 | 42 | 43 | 44 | 45 | 46 | 47 | 48 | 49 | 50 | | |
| 6#P2 | | | | | | 51 | 52 | 53 | 54 | 55 | 56 | 57 | 58 | 59 | 60 | |
| 7 | | | | | | | 61 | 62 | 63 | 64 | 65 | 66 | 67 | 68 | 69 | 70 |
| 8 | | | | | | | | 71 | 72 | 73 | 74 | 75 | 76 | 77 | 78 | 79 | 80 |
| BINS | 1 | 13 | 36 | 70 | 115 | 171 | 238 | 316 | 324 | 332 | 329 | 315 | 290 | 254 | 207 | 149 | 80 |

| | | | | | | | | | | | | | | | | |
|---|---|---|---|---|---|---|---|---|---|---|---|---|---|---|---|---|
| 1 | | | | | | | | 1 | 2 | 3 | 4 | 5 | 6 | 7 | 8 | 9 | 10 |
| 2 | | | | | | | 11 | 12 | 13 | 14 | 15 | 16 | 17 | 18 | 19 | 20 |
| 3#P1 | | | | | | 21 | 22 | 23 | 24 | 25 | 26 | 27 | 28 | 29 | 30 | |
| 4 | | | | | 31 | 32 | 33 | 34 | 35 | 36 | 37 | 38 | 39 | 40 | | |
| 5 | | | | 41 | 42 | 43 | 44 | 45 | 46 | 47 | 48 | 49 | 50 | | | |
| 6#P2 | | | 51 | 52 | 53 | 54 | 55 | 56 | 57 | 58 | 59 | 60 | | | | |
| 7 | | 61 | 62 | 63 | 64 | 65 | 66 | 67 | 68 | 69 | 70 | | | | | |
| 8 | 71 | 72 | 73 | 74 | 75 | 76 | 77 | 78 | 79 | 80 | | | | | | |
| BINS | 71 | 133 | 186 | 230 | 265 | 291 | 308 | 316 | 324 | 332 | 259 | 195 | 140 | 94 | 57 | 29 | 10 |

Fig. 6h

P1 SP-Chunks

| | | | | | | | | | | | | | | | | |
|---|---|---|---|---|---|---|---|---|---|---|---|---|---|---|---|---|
| 1 | 1 | 2 | 3 | 4 | 5 | 6 | 7 | 8 | 9 | 10 | | | | | | |
| 2 | | 11 | 12 | 13 | 14 | 15 | 16 | 17 | 18 | 19 | 20 | | | | | |
| BINS_P1_12 | 1 | 13 | 15 | 17 | 19 | 21 | 23 | 25 | 27 | 29 | 20 | 0 | 0 | 0 | 0 | 0 | 0 |

| | | | | | | | | | | | | | | | | |
|---|---|---|---|---|---|---|---|---|---|---|---|---|---|---|---|---|
| 4 | | | | 31 | 32 | 33 | 34 | 35 | 36 | 37 | 38 | 39 | 40 | | | |
| 5 | | | | | 41 | 42 | 43 | 44 | 45 | 46 | 47 | 48 | 49 | 50 | | |
| BINS_P1_45 | 0 | 0 | 0 | 31 | 73 | 75 | 77 | 79 | 81 | 83 | 85 | 87 | 89 | 50 | 0 | 0 | 0 |

| | | | | | | | | | | | | | | | | |
|---|---|---|---|---|---|---|---|---|---|---|---|---|---|---|---|---|
| 7 | | | | | | | 61 | 62 | 63 | 64 | 65 | 66 | 67 | 68 | 69 | 70 | |
| 8 | | | | | | | | 71 | 72 | 73 | 74 | 75 | 76 | 77 | 78 | 79 | 80 |
| BINS_P1_78 | 0 | 0 | 0 | 0 | 0 | 0 | 61 | 133 | 135 | 137 | 139 | 141 | 143 | 145 | 147 | 149 | 80 |

Fig. 6i

P-1 SP-Chunks

| | | | | | | | | | | | | | | | | |
|---|---|---|---|---|---|---|---|---|---|---|---|---|---|---|---|---|
| 1 | | | | | | | | 1 | 2 | 3 | 4 | 5 | 6 | 7 | 8 | 9 | 10 |
| 2 | | | | | | | 11 | 12 | 13 | 14 | 15 | 16 | 17 | 18 | 19 | 20 | |
| BINS_P-1_12 | 0 | 0 | 0 | 0 | 0 | 0 | 11 | 13 | 15 | 17 | 19 | 21 | 23 | 25 | 27 | 29 | 10 |

| | | | | | | | | | | | | | | | | |
|---|---|---|---|---|---|---|---|---|---|---|---|---|---|---|---|---|
| | | | 31 | 32 | 33 | 34 | 35 | 36 | 37 | 38 | 39 | 40 | | | | |
| | | 41 | 42 | 43 | 44 | 45 | 46 | 47 | 48 | 49 | 50 | | | | | |
| PINS_P-1_45 | 0 | 0 | 41 | 73 | 75 | 77 | 79 | 81 | 83 | 85 | 87 | 89 | 40 | 0 | 0 | 0 | 0 |

| | | | | | | | | | | | | | | | | |
|---|---|---|---|---|---|---|---|---|---|---|---|---|---|---|---|---|
| 7 | | 61 | 62 | 63 | 64 | 65 | 66 | 67 | 68 | 69 | 70 | | | | | |
| 8 | 71 | 72 | 73 | 74 | 75 | 76 | 77 | 78 | 79 | 80 | | | | | | |
| PBINS_P-1_78 | 71 | 133 | 135 | 137 | 139 | 141 | 143 | 145 | 147 | 149 | 70 | 0 | 0 | 0 | 0 | 0 | 0 |

Fig. 6j

P1 SP-Chunk 124578

| | | | | | | | | | | | | | | | | |
|---|---|---|---|---|---|---|---|---|---|---|---|---|---|---|---|---|
| BINS_P1_12 | 1 | 13 | 15 | 17 | 19 | 21 | 23 | 25 | 27 | 29 | 20 | 0 | 0 | 0 | 0 | 0 | 0 |
| BINS_P1_45 | 0 | 0 | 0 | 31 | 73 | 75 | 77 | 79 | 81 | 83 | 85 | 87 | 89 | 50 | 0 | 0 | 0 |
| BINS_P1_78 | 0 | 0 | 0 | 0 | 0 | 0 | 61 | 133 | 135 | 137 | 139 | 141 | 143 | 145 | 147 | 149 | 80 |
| PBINS_P1_124578 | 1 | 13 | 15 | 48 | 92 | 96 | 161 | 237 | 243 | 249 | 244 | 228 | 232 | 195 | 147 | 149 | 80 |

Fig. 6k

P-1 SP-Chunk 124578

| | | | | | | | | | | | | | | | | |
|---|---|---|---|---|---|---|---|---|---|---|---|---|---|---|---|---|
| BINS_P-1_12 | 0 | 0 | 0 | 0 | 0 | 0 | 11 | 13 | 15 | 17 | 19 | 21 | 23 | 25 | 27 | 29 | 10 |
| PINS_P-1_45 | 0 | 0 | 41 | 73 | 75 | 77 | 79 | 81 | 83 | 85 | 87 | 89 | 40 | 0 | 0 | 0 | 0 |
| PBINS_P-1_78 | 71 | 133 | 135 | 137 | 139 | 141 | 143 | 145 | 147 | 149 | 70 | 0 | 0 | 0 | 0 | 0 | 0 |
| PBINS_P-1_124578 | 71 | 133 | 176 | 210 | 214 | 218 | 233 | 239 | 245 | 251 | 176 | 110 | 63 | 25 | 27 | 29 | 10 |

Fig. 6l

P1 SP-Chunk 124578

| | | | | | | | | | | | | | | | | |
|---|---|---|---|---|---|---|---|---|---|---|---|---|---|---|---|---|
| BINS | 1 | 13 | 36 | 70 | 115 | 171 | 238 | 316 | 324 | 332 | 329 | 315 | 290 | 254 | 207 | 149 | 80 |
| PBINS_P1_124578 | 1 | 13 | 15 | 48 | 92 | 96 | 161 | 237 | 243 | 249 | 244 | 228 | 232 | 195 | 147 | 149 | 80 |
| ROW3 | | | 0 | 0 | 0 | 0 | 0 | 0 | 0 | 0 | 0 | 0 | | | | | |
| ROW6 | | | | | | | 0 | 0 | 0 | 0 | 0 | 0 | 0 | 0 | 0 | 0 | |

Fig. 6m

P-1 SP-Chunk 124578

| | | | | | | | | | | | | | | | | |
|---|---|---|---|---|---|---|---|---|---|---|---|---|---|---|---|---|
| BINS | 71 | 133 | 186 | 230 | 265 | 291 | 308 | 316 | 324 | 332 | 259 | 195 | 140 | 94 | 57 | 29 | 10 |
| PBINS_P-1_124578 | 71 | 133 | 176 | 210 | 214 | 218 | 233 | 239 | 245 | 251 | 176 | 110 | 63 | 25 | 27 | 29 | 10 |
| ROW3 | | | | | | 0 | 0 | 0 | 0 | 0 | 0 | 0 | 0 | 0 | 0 | | |
| ROW6 | | | 0 | 0 | 0 | 0 | 0 | 0 | 0 | 0 | 0 | 0 | | | | | |

Fig. 6n

P1 SP-Chunk 124578

| | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| 1 | 1 | 2 | 3 | 4 | 5 | 6 | 7 | 8 | 9 | 10 | | | | | | | |
| 2 | | 11 | 12 | 13 | 14 | 15 | 16 | 17 | 18 | 19 | 20 | | | | | | |
| 3#P1 | | | 0 | 0 | 0 | 0 | 0 | 0 | 0 | 0 | 0 | 0 | | | | | |
| 4 | | | | 31 | 32 | 33 | 34 | 35 | 36 | 37 | 38 | 39 | 40 | | | | |
| 5 | | | | | 41 | 42 | 43 | 44 | 45 | 46 | 47 | 48 | 49 | 50 | | | |
| 6#P2 | | | | | | 0 | 0 | 0 | 0 | 0 | 0 | 0 | 0 | 0 | 0 | | |
| 7 | | | | | | | 61 | 62 | 63 | 64 | 65 | 66 | 67 | 68 | 69 | 70 | |
| 8 | | | | | | | | 71 | 72 | 73 | 74 | 75 | 76 | 77 | 78 | 79 | 80 |
| BINS | 1 | 13 | 15 | 48 | 92 | 96 | 161 | 237 | 243 | 249 | 244 | 228 | 232 | 195 | 147 | 149 | 80 |

Fig. 6o

P-1 SP-Chunk 124578

| | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| 1 | | | | | | | | 1 | 2 | 3 | 4 | 5 | 6 | 7 | 8 | 9 | 10 |
| 2 | | | | | | | 11 | 12 | 13 | 14 | 15 | 16 | 17 | 18 | 19 | 20 | |
| 3#P1 | | | | | | 0 | 0 | 0 | 0 | 0 | 0 | 0 | 0 | 0 | 0 | | |
| 4 | | | | | 31 | 32 | 33 | 34 | 35 | 36 | 37 | 38 | 39 | 40 | | | |
| 5 | | | | 41 | 42 | 43 | 44 | 45 | 46 | 47 | 48 | 49 | 50 | | | | |
| 6#P2 | | | 0 | 0 | 0 | 0 | 0 | 0 | 0 | 0 | 0 | 0 | | | | | |
| 7 | | 61 | 62 | 63 | 64 | 65 | 66 | 67 | 68 | 69 | 70 | | | | | | |
| 8 | 71 | 72 | 73 | 74 | 75 | 76 | 77 | 78 | 79 | 80 | | | | | | | |
| BINS | 71 | 133 | 135 | 178 | 212 | 216 | 231 | 237 | 243 | 249 | 174 | 108 | 112 | 65 | 27 | 29 | 10 |

Fig. 6p

| BINS | 1 | 13 | 36 | 70 | 115 | 171 | 238 | 316 | 324 | 332 | 329 | 315 | 290 | 254 | 207 | 149 | 80 |
|---|---|---|---|---|---|---|---|---|---|---|---|---|---|---|---|---|---|
| PBINS_P1_124578 | 1 | 13 | 15 | 48 | 92 | 96 | 161 | 237 | 243 | 249 | 244 | 228 | 232 | 195 | 147 | 149 | 80 |
| ROW3 | | | 21 | 22 | 23 | 0 | 0 | 0 | 0 | 0 | 0 | 0 | | | | | |
| ROW6 | | | | | | 0 | 0 | 0 | 0 | 0 | 0 | 0 | 0 | 0 | 0 | 0 | |

Fig. 6q

| BINS | 71 | 133 | 186 | 230 | 265 | 291 | 308 | 316 | 324 | 332 | 259 | 195 | 140 | 94 | 57 | 29 | 10 |
|---|---|---|---|---|---|---|---|---|---|---|---|---|---|---|---|---|---|
| PBINS_P-1_124578 | 71 | 133 | 135 | 178 | 212 | 237 | 253 | 260 | 243 | 249 | 174 | 108 | 112 | 65 | 27 | 29 | 10 |
| ROW3 | | | | | | | | | 0 | 0 | 0 | 0 | 0 | 0 | 0 | | |
| ROW6 | | | 51 | 52 | 53 | 54 | 55 | 56 | 0 | 0 | 0 | 0 | | | | | |

Fig. 6r

| BINS | 1 | 13 | 36 | 70 | 115 | 171 | 238 | 316 | 324 | 332 | 329 | 315 | 290 | 254 | 207 | 149 | 80 |
|---|---|---|---|---|---|---|---|---|---|---|---|---|---|---|---|---|---|
| PBINS_P1_124578 | 1 | 13 | 36 | 70 | 115 | 147 | 213 | 290 | 297 | 304 | 300 | 228 | 232 | 195 | 147 | 149 | 80 |
| ROW3 | | | | | | 24 | 25 | 26 | 27 | 28 | 29 | 0 | | | | | |
| ROW6 | | | | | | | | | | | | 0 | 0 | 0 | 0 | | |

Fig. 6s

| BINS | 71 | 133 | 186 | 230 | 265 | 291 | 308 | 316 | 324 | 332 | 259 | 195 | 140 | 94 | 57 | 29 | 10 |
|---|---|---|---|---|---|---|---|---|---|---|---|---|---|---|---|---|---|
| PBINS_P-1_124578 | 71 | 133 | 186 | 230 | 265 | 291 | 308 | 316 | 267 | 274 | 200 | 135 | 140 | 94 | 27 | 29 | 10 |
| ROW3 | | | | | | | | | | | | | | | 0 | | |
| ROW6 | | | | | | | | | 57 | 58 | 59 | 60 | | | | | |

Fig. 6t

| BINS | 1 | 13 | 36 | 70 | 115 | 171 | 238 | 316 | 324 | 332 | 329 | 315 | 290 | 254 | 207 | 149 | 80 |
|---|---|---|---|---|---|---|---|---|---|---|---|---|---|---|---|---|---|
| PBINS_P1_124578 | 1 | 13 | 36 | 70 | 115 | 171 | 238 | 316 | 324 | 332 | 329 | 285 | 290 | 254 | 207 | 149 | 80 |
| ROW3 | | | | | | | | | | | | 30 | | | | | |
| ROW6 | | | | | | | | | | | | | | | | | |

Fig. 6u

Update

| A | B | C | D | E | F | G | H | I | J | K | L | M | N | O | P | Q | R | S | T | U |

Fig 7a

| 1 | A | B | C | D | E | F | G |
|---|---|---|---|---|---|---|---|
| 2 | H | I | J | K | L | M | N |
| 3 | O | P | Q | R | S | T | U |

Fig 7b

| P(1,1) | A | B∧H | C∧I∧O | D∧J∧P | E∧K∧Q | F∧L∧R | G∧M∧S | N∧T | U | | |
| P(2,1) | A | B | C∧H | D∧I | E∧J∧O | F∧K∧P | G∧L∧Q | M∧R | N∧S | T | U |

Fig 7c

| A | X | Y | D | E | F | G | H | I | J | K | L | M | N | O | P | Q | R | S | T | U |

Fig 7d

| 1 | A | X | Y | D | E | F | G |
|---|---|---|---|---|---|---|---|
| 2 | H | I | J | K | L | M | N |
| 3 | O | P | Q | R | S | T | U |

Fig 7e

| P(1,1) | A | X∧H | Y∧I∧O | D∧J∧P | E∧K∧Q | F∧L∧R | G∧M∧S | N∧T | U | | |
| P(2,1) | A | X | Y∧H | D∧I | E∧J∧O | F∧K∧P | G∧L∧Q | M∧R | N∧S | T | U |

Fig 7f

| 1  | A | B | C | D | E | F | G |
|----|---|---|---|---|---|---|---|
| 1' | A | X | Y | D | E | F | G |

Fig 7g

| 1 | A∧A(=0) | B∧X | C∧Y | D∧D | E∧E | F∧F | G∧G |

Fig 7h

| P(1,1) | A | B∧H∧(B∧X) | C∧I∧O∧(C∧Y) | D∧J∧P | E∧K∧Q | F∧L∧R | G∧M∧S | N∧T | U |   |   |
|--------|---|-----------|-------------|-------|-------|-------|-------|-----|---|---|---|
| P(2,1) | A | B∧(B∧X)   | C∧H∧(C∧Y)   | D∧I   | E∧J∧O | F∧K∧P | G∧L∧Q | M∧R | N∧S | T | U |

Fig 7i

| P(1,1) | A | X∧H |     | Y∧I∧O |     | D∧J∧P | E∧K∧Q | F∧L∧R | G∧M∧S | N∧T | U |   |   |
|--------|---|-----|-----|-------|-----|-------|-------|-------|-------|-----|---|---|---|
| P(2,1) | A | X   |     | Y∧H   |     | D∧I   | E∧J∧O | F∧K∧P | G∧L∧Q | M∧R | N∧S | T | U |

Fig 7j

METHOD AND DEVICES FOR A REDUCED REPAIR AND UPDATE ERASURE CODE

CROSS-REFERENCE TO RELATED APPLICATION

This application claims the benefit of U.S. Provisional Application No. 62/588,578, filed Nov. 20, 2017, which is incorporated herein by reference in its entirety.

BACKGROUND

Field of the Invention

The present advancements generally relate to an erasure code design based on a Mojette Transform using a combination of systematic code and non-systematic code for data storage, and in particular for the use in high efficiency distributed data transfer over non perfect networks having a reduced repair and update effort.

Description of the Related Art

Data corruption in data storage environments can have many different causes, such as hardware, network, disks, environmental, radiation, electrical, software and more, all leading to a data error in client applications. In today's data environment where more and more focus is on distributed data and applications, the problem moves from more secure data centers (DCs), to small Internet of Things, IoT, devices and Internet. To mitigate problems with data errors, DCs replicate the data over several DC sites to have copies of the data available at all times. However, replicating copies of data creates time gaps between the data copies and multiplies the amount of data and it also creates a lot of extra work for the DCs to be able to maintain all the data.

The introduction of Forward Error Correction, FEC, codes greatly improved this situation in DCs for the handling of Redundant Array of Inexpensive Disks, RAID. However, the present Reed-Solomon FEC code and similar FEC codes are not well suited for distributed data storage handling of tomorrow's needs for widely distributed storage. Today the standard for storage is to use systematic erasure code, where the systematic code refers to the case when input data is embedded in the encoded output, and on the other side a non-systematic code refers to the case where the output does not contain the input symbols. By nature the Mojette transformation is a non-systematic code and does not have an optimal performance during non-erasure operation modes and also does not fit directly into legacy data storage erasure code frameworks or erasure code aware code frameworks designed to for systemic erasure code libraries.

The Mojette transform is by nature a non-systematic code and the parity chunks have a larger size (1+ε) than a corresponding systematic chunk, where epsilon is ε>0 making the parity chunks (m) containing more information than data chunks. This property of the m parity chunks can later be seen to be used on modern CPU's for the purpose of reducing the CPU cycles of the decoding process having aligned packages of the m parity projections with a ε>>0, as a basis to create an optimal performance.

As an example of systematic code, Reed-Solomon codes runs with optimal performance when no erasure is present when it is a systematic code but suffers severely during operation when there is a need for erasure to be present. This unpredictable performance of Reed-Solomon makes the use of erasure code mainly suitable for cold data storage and applications where performance is of less importance. There is a need for an improved erasure codes having Reduced Repair, Network, Compute and Update Effort (RRE) for repair of lost chunks with low network impact together with low compute overhead and payload update functionality in distributed storage systems, having multiple parts where failure become the default state, and always running the erasure code in a state with failures. The Mojette transform having RRE for both systematic and non-systematic erasure code installations aims to provide such a mechanism to at least mitigate some of the drawbacks of the present encoding and decoding mechanisms and reduce the hurdle to make the use of erasure coded systems the default way to create data redundancy.

SUMMARY

The proposed technology provides mechanisms whereby encoding and decoding of data in the form of data blocks, files or other formats can be improved by dividing the encoding into multiple sub-blocks that are only parts of the full data block and thereby reduce both encoding and decoding effort for a single or not connected multiple failure erasure decoding operation. Making a simple example having a systematic Mojette Transform erasure code the segmentation is most simply done using rows in the MT block as base for dividing up the full data into sub-blocks. For a data block consisting of 15 rows, this data block can be divided up into 3 sub-blocks having all sub-blocks of the same size with 5 rows. These new 3 sub-blocks will then solve respective rows 1 to 5, 6 to 10, 11 to 15. MT is especially well suited for this kind of encoding operation and also handles uneven number of rows in the sub-blocks without increasing the complexity of the decoding operation. Combining sub-block encoding with full block encodings will create both full redundancy projections and RRE Sub-Block Parity Chunks (SBPC) that can be configured to solve repairs in the most efficient way and thereby reducing both the compute effort and the network effort to reestablish the full redundancy of the system. Reducing both the Compute and Network effort adds up to the full RRE for the distributed storage system.

The proposed technology also provides for a computationally non-intensive correction since the correction of erroneously decoded data only utilizes arithmetic operations in the form of additions and subtractions. This will reduce the computational demands when correcting data that has been stored by means of distributed data storage, for example.

An exemplary RRE (Reduced Repair Effort) includes Mojette Transform (MT) algorithms that enables a distributed system using erasure code to reduce the repair and update effort.

An RRE-SP (Reduced Repair Effort-Sub-Packetization) reduces the amount of data and number of chunks to be transferred from a distributed storage backend to the decoder node in one or multiple RRE-SP steps, using a sub-node packetization of a number of data chunks and/or parity chunks into one or more SP-chunks using the MT algorithm and optimally using step size and p value of the parity chunk to be used for the repair of the lost data-chunk or parity-chunk. RRE-SP saves network effort, and has a cost in computation of the sub-node packetization during a repair operation.

An RRE-LR (Reduced Repair Effort-Locally Recoverable) reduces the number of chunks needed for the repair by having parity-chunks for only a part of the total number of data-chunks SBPC, and thereby reducing the needed total number of chunks associated in a repair. This saves both compute and network effort during a repair. If SBPC=1 is configured, RRE-LR becomes a standard MT parity projection m.

RRE-PU (Reduced Repair Effort-Partial Update) reduces the number of compute operations during an update of a payload by only recalculating the actual number of updated pixels and not the full payload, thereby saving compute and network effort for an update operation.

The RRE can use RRE-SP, RRE-LR, RRE-PU in combinations or as single MT optimizations for an application serving different purposes to improve the RRE functionality. Throughout the application it should be understood that if RRE-LR is not configured, no lr or third type of parity chunk projections will be present. On the other hand if RRE-LR is configured there could be both m and lr or second and third type of projections present. There could also be situations where only RRE-LR is present having only lr or third type of chunk projections present. The Mojette Transform operations in systematic or non-systematic form will be denoted as MT for simplicity throughout this application.

The present advancements also provide mechanisms whereby encoding and decoding of data in the form of data blocks, files or other formats can be improved by dividing the decoding phase up into a minimum of two phases, the preamble phase and the stable phase, and then efficiently solve multiple pixels per iteration during the stable phase. The present advancements enable, in particular, for a more robust data storage since the encoding and decoding mechanisms disclosed herein enables a reconstruction or rebuilding of erroneously decoded data or erased data. The present advancements also provide for a computationally non-intensive correction since the correction of erroneously decoded data only utilizes arithmetic operations in the form of additions and subtractions. This reduces computational demands when correcting data that has been stored in distributed data storage, for example.

The present advancements further describe creating a high performance, high availability, erasure code, referred to herein as OPTFEC, with built in dual mode operation, systematic and non-systematic, together with error detection and correction comprising a Mojette transform in combination with optimal performance operation during non-erasure operations. The present advancements also describe how to introduce the OPTFEC code for DC implementations as well as for widely distributed storage networks, such as IoT and Cloud Storage, and how an OPTFEC is included in the data transform.

According to an exemplary aspect of the present advancements, a method of redundantly encoding data includes receiving, by circuitry, data to be encoded, and formatting, by the circuitry, the data into rows and columns. The method also includes generating, by the circuitry, a first set of projections of the data based on an encoding transform using a first parameter value for an encoding parameter of the encoding transform, and generating, by the circuitry, a second set of projections of the data based on the encoding transform using a second parameter value for the encoding parameter that is different from the first parameter value. The first and second projections are then stored as the encoded data. According to another exemplary aspect of the present advancements, an encoding apparatus that redundantly encodes data includes a communication circuit configured to receive data to be encoded, and a processing circuit. The processing circuit formats the data into rows and columns, and generates a first set of projections based on an encoding transform using a first parameter value for an encoding parameter of the encoding transform. The processing circuit also generates a second set of projections based on the encoding transform using a second parameter value for the encoding parameter that is different from the first parameter value. The processing circuit then stores the first and second sets of projections in a memory as encoded data corresponding to the data received.

According to a further exemplary aspect of the present disclosure, a method of decoding encoded data includes reading, by circuitry and from a memory, settings for determining how to decode the encoded data, where the settings include at least a number of data fragments and a number of parity fragments needed for decoding of the data. The method also includes reading, by the circuitry, the encoded data, and determining, by the circuitry, whether a number of projections in a first set of projections of the encoded data is equal to the number of data fragments indicated in the settings. The method further includes selecting, by the circuitry, one of a first decoding mode and a second decoding mode to decode the encoded data based on whether the number of projections in the first set of projections equals the number of data fragments indicated in the settings, and decoding, by the circuitry, the encoded data with the selected one of the first and second decoding modes. The circuitry then outputs data generated by decoding the encoded data according to the method.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2a illustrates a matrix showing the geometrical relationship in an RRE-LR configuration for k, m, and lr chunks according to exemplary aspects of the present disclosure;

FIG. 2b illustrates a matrix for a RRE-LR configuration having k=8 and 80 pixels according to exemplary aspects of the present disclosure;

FIG. 2c illustrates the configured RRE-LR k=8 matrix filled with data;

FIG. 3a illustrates geometrical representation of the MT for a p(1.1) projection on the matrix having k=8 with bins calculated according to exemplary aspects of the present disclosure;

FIG. 3b illustrates a matrix showing the geometrical representation of a MT operation on the FIG. 2c with p(-1,1) with the bins calculated according to exemplary aspects of the present disclosure;

FIG. 3c illustrates a matrix showing the use of MT for generating the lr1,1(2,1) and the lr1,2(2,1) parity chunks for the matrix in FIG. 2c according to exemplary aspects of the present disclosure;

FIG. 4a illustrates an example of the FIG. 2c matrix having two k chunks lost for row 6 and 7 that in this example will be repaired using parity chunks p(−1,1) and lr1,2(2,1) according to exemplary aspects of the present disclosure;

FIG. 4b illustrates the parity chunk p(−1,1) with the two rows 6 and 7 marked as failed according to exemplary aspects of the present disclosure;

FIG. 4c illustrates the parity chunk lr1,2(2,1) (lr parity chunk one with two sub-parts, having the projection p(2,1)) that will be used for the repair of row 6 and 7 together with parity chunk m here with the projection p(−1,1) according to exemplary aspects of the present disclosure;

FIG. 4d illustrates the result after the first MT iteration over first parity chunk starting with lr1,2(2,1) when this has the biggest projection angle and then m parity chunk with the projection p(−1,1) according to exemplary aspects of the present disclosure;

FIG. 4e illustrates the result after the first iteration for the lr parity chunk lr1,2(2,1) having all available data pixels blanked out according to exemplary aspects of the present disclosure;

FIG. 4f illustrates the matrix after MT operation using the lr parity chunk lr1,2(2,1) according to exemplary aspects of the present disclosure;

FIG. 4g illustrates the status of the m parity chunk with the projection p(−1,1) having all available data blanked out. Here it can be easily seen that the 4 remaining pixels can be just copied into their respective positions in the matrix according to exemplary aspects of the present disclosure;

FIG. 4h illustrates the fully repaired data matrix using the lr parity chunk lr1,2(2,1) and the m parity chunk with the projection p(−1,1) according to exemplary aspects of the present disclosure;

FIG. 5a illustrates a data matrix having k=8 and 80 pixels to be used for a first example of RRE-SP (Reduced Repair Effort-Sub-Packetization) according to exemplary aspects of the present disclosure;

FIG. 5b illustrates the first m parity chunk P1 (p(1,1)) to be used in the first RRE-SP example according to exemplary aspects of the present disclosure;

FIG. 5c illustrates the second projection type, m parity chunk P-1 (p(−1,1)) to be used according to exemplary aspects of the present disclosure;

FIG. 5d illustrates the data matrix with k=8 and 80 pixels, with row 5 marked with failure according to exemplary aspects of the present disclosure;

FIG. 5e illustrates an MT RRE-SP compressed or packetized SP-chunk with all bins calculated according to exemplary aspects of the present disclosure;

FIG. 5f illustrates the final RRE-SP MT operation for the repair of failed row 5 by subtracting Partial_BINS_X5_P1 the in FIG. 5e calculated bins, from the m parity chunk P1 (p(1,1)) according to exemplary aspects of the present disclosure;

FIG. 6a illustrates a second example with 4 sub-chunks with the RRE-SP MT operation performed for different rows. Row 7 is here marked as failed and will be repaired using the m parity chunk P1 (p(1,1)) according to exemplary aspects of the present disclosure;

FIG. 6g illustrates the parity chunk 1 p(1,1) according to exemplary aspects of the present disclosure;

FIG. 6h illustrates the parity chunk 2 p(−1,1) according to exemplary aspects of the present disclosure;

FIG. 6i illustrates the SP-chunks, MT transformed using projection p(1,1) set by parity chunk 1 according to exemplary aspects of the present disclosure;

FIG. 6j illustrates the SP-chunks, MT transformed using projection p(−1,1) set by parity chunk 2 according to exemplary aspects of the present disclosure;

FIG. 6k illustrates the combined SP-Chunk using projection p(1,1) set by parity chunk 1 according to exemplary aspects of the present disclosure;

FIG. 6l illustrates the combined SP-Chunk using projection p(−1,1) set by parity chunk 2 according to exemplary aspects of the present disclosure;

FIG. 6m illustrates the initial stage for the MT to start decoding ROW 3 using P1 according to exemplary aspects of the present disclosure;

FIG. 6n illustrates the initial stage for the MT to start decoding ROW 6 using P2 according to exemplary aspects of the present disclosure;

FIG. 6o illustrates another representation of the SP-chunk 124578 for P1 according to exemplary aspects of the present disclosure;

FIG. 6p illustrates another representation of the SP-chunk 124578 for P2 according to exemplary aspects of the present disclosure;

FIG. 6q illustrates the first step solving the initial 3 free pixels using P1 for ROW3 according to exemplary aspects of the present disclosure;

FIG. 6r illustrates the second step solving the 6 free pixels using P-1 for ROW6 according to exemplary aspects of the present disclosure;

FIG. 6s illustrates the third step solving 6 free pixels using P1 for ROW3 according to exemplary aspects of the present disclosure;

FIG. 6t illustrates the 4th step solving 4 free pixels for ROW6 using P2 according to exemplary aspects of the present disclosure;

FIG. 6u illustrates the final 5th step using P1 to MT decode the final pixel left to solve for ROW3 according to exemplary aspects of the present disclosure;

FIG. 7a illustrates the source data for a RRE-PU example having 21 pixels according to exemplary aspects of the present disclosure;

FIG. 7b illustrates the 7a source data put into a 3 row matrix with 7 pixels per row according to exemplary aspects of the present disclosure;

FIG. 7c illustrates the Mojette transform on the matrix calculating projection P(1,1) and P(2,1), where the A-operator here is a XOR operation according to exemplary aspects of the present disclosure;

FIG. 7d illustrates a partially updated source data where grey area denotes the partial updated part of the source code according to exemplary aspects of the present disclosure;

FIG. 7e illustrates the 3 row matrix with the partially updated source data inserted with the resulting data chunks, row one is here the new data chunk indicated by the denoted grey area according to exemplary aspects of the present disclosure;

FIG. 7f illustrates the Mojette transform on the matrix calculating partially updated projection P(1,1) and P(2,1) on the partial updated source code according to exemplary aspects of the present disclosure;

FIG. 7g illustrates row one k data chunk before and after the partial update of the source data according to exemplary aspects of the present disclosure;

FIG. 7h illustrates the calculation of the difference between the original first row k data chunk and the new partially updated k data chunk according to exemplary aspects of the present disclosure;

FIG. 7i illustrates when the difference between original row one k data chunk and partial updated k data chunk is applied to the MT projections P(1,1) and P(2,1) according to data index and projection angle according to exemplary aspects of the present disclosure; and FIG. 7j illustrates the result of the MT RRE-PU update with only a partial update of the source code, where the grey denotes the updated data in the two m parity chunks P(1,1) and P(2,1) according to exemplary aspects of the present disclosure

DETAILED DESCRIPTION

Figure 1A:
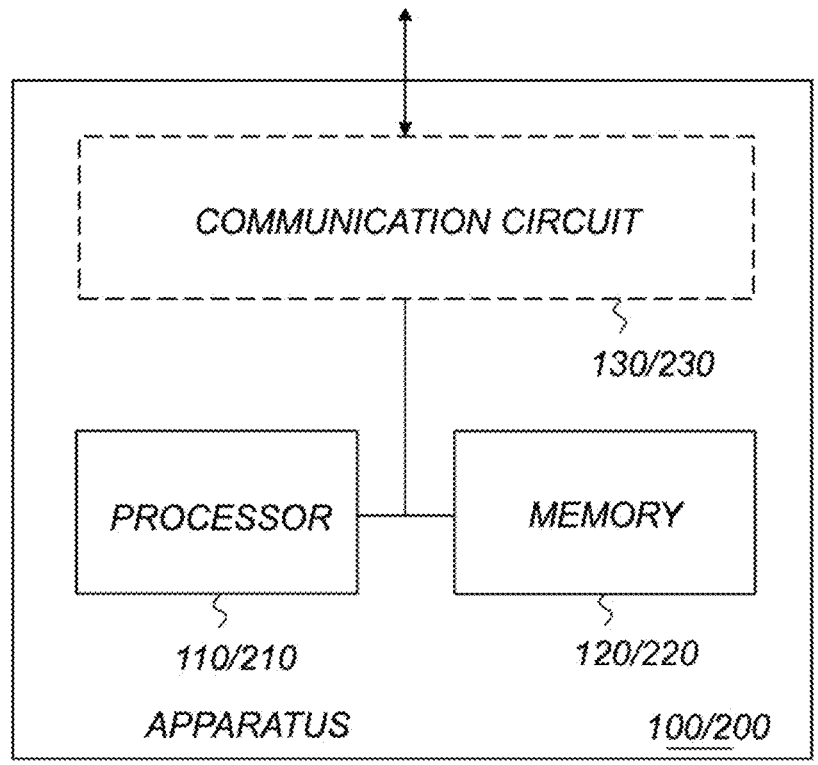
FIG. 1a illustrates an apparatus according to exemplary aspects of the present disclosure.

Referring now to the drawings, wherein like reference numerals designate identical or corresponding parts throughout the several views.

There is a great need for a high performance FEC code for distributed data storage over non perfect networks. Preferably, such a code should be adapted for widely distributed storage solutions whereby end-to-end data integrity can be achieved. The code should preferably also provide for a secure and robust way to reconstruct faulty encoded data. Such data faults have become the norm for high-end computing clusters, and even a single error can have profound effects on applications by causing a cascading pattern of corruption, which in most cases spread to other processes.

Storage servers today have large capacities to store data and the intense use of social and surveillance data boosts this need for high availability and distributed storage at low cost. Smaller devices, such as phones, smartphones, tablets and IoT devices, also have a need for higher and higher performance when they generate more and more data to be transferred to stable storage in the cloud or into a private DC.

Data loss in any application is unacceptable and this drives the DC to secure the data by replication to other storages or DCs to, thereby, always have copies of the data. This makes it possible to reconstruct the data if data or storage is lost due to any type of circumstance. Replication is, however, suboptimal when handling large amount of data since all data has to be transferred and replicated in full if a node is lost. Replication also has the implication of having different versions of data on different storages, which makes the handling and maintenance very difficult and work intensive for the administrator. The amount of data in a replication environment is also normally a factor of 3 to 7 times the original data due to the above needs for security and having the data distributed around the globe or between offices.

The introduction of erasure coding techniques, such as Reed-Solomon, has greatly improved the situation within DCs. In these situations replication is substituted by RAID, thereby reducing the need for storage capacity by a factor 3 to 5, resulting in cost, environmental, maintenance and safety benefits within the DCs.

In today's erasure code libraries, an industry standard has been established to give different setting parameters a standard name making the integration of different libraries easier into applications. In what follows k denotes the number of data fragments or data chunks for OPTFEC proj(1, 0) projections and also denotes the minimum number of projections for OPTFEC to rebuild the block, and the number of rows in the OPTFEC block. Also, m denotes the number of parity fragments or parity chunks for OPTFEC proj(pi, qi≠0) projections, and also the maximum number of projections that can be lost while still enabling a rebuilding or reconstruction of the data block. Moreover, packet size={bytes} or only b denotes the block-size or file size, giving the size of the matrix of FIGS. 6a and 6b used in encoding and decoding of data according to the exemplary aspects of the present advancements.

The Reed-Solomon erasure code also has a standard implementation where the data generating application is using the non-erasure situation to be able to read and verify data all the way out on the backend storage node. The data generating application then also handles all the calls for data and parity chunks and detects if there is no erasure present and then in the application itself makes the reassembly of the data from the data chunks. If, however, there is a data chunk missing the received number of data chunks together with the necessary number of parity chunks is delivered to the erasure code decoding interface for a decoding operation.

The encoding and decoding can be run on an application that is erasure code aware, and the different steps can be divided among different hardware and software layers for an optimal functionality. Both the encoding and decoding operations can be executed on distributed computer nodes to offload intensive calculations and also offload rebuild and data traffic from small low power CPU's on network edges. However, the Reed-Solomon type of erasure codes are not suited for distributed applications where latency can have severe impacts on performance if one node fails, and communication with all other nodes over Internet is needed for the data reconstruction. Thus, distributed storage applications require an erasure code that is discrete and not Central Processing Unit (CPU) intensive for the client communicating with one or more storage nodes.

Data input for erasure coding is generated from many different sources and applications and then passed, in its full size or as chunks, to the input interface of the erasure code for the encoding operations. The input data can be movie files, document files, executables, live video, or any type of data as one of ordinary skill would recognize. The data delivered to the input interface is transferred into a data matrix that contains the same number of rows as the configuration has k data chunks. The length of the rows are determined by the size of the data delivered to the input interface for the encoding operations or pre-chunked to a specific size either by the application or the erasure code, given by the input configuration settings. The decoder starts to decode the k data chunks row by row and then calculates the m parity chunks determined by the configuration settings for the number of m parity chunks.

When the k data chunks and the m parity chunks are present from the encoder they are transferred to respective configured backend for safe keeping on separate disks or other storage. The backend can be a single disk, or a folder in a filesystem or a storage interface, such as for example S3, NFS or a block device such as ISCSI, as long as the m parity chunks and k data chunks are separated to have redundancy so that not all m and k chunks are lost at once.

After the encoding is done, the separate m and k chunks do not contain all information needed to reassemble or rebuild and decode the data, and at least k number of chunks need to be supplied to the decoder interface of the erasure code in order to decode the data. That the data cannot be reassembled from different backends without k number of chunks can also be used for data security purposes when the decoding operation needs to have access to multiple backend storage nodes or disks.

The decoding works according to the given settings to reassemble or decode the data and parity chunks delivered to the interface of the decoder. If less than k number of k data chunks are delivered to the decoder interface, a decoding operation is necessary. If k data chunks are delivered, a reassemble operation can transfer the k data chunk data into the chosen matrix, and depending on the matrix layout and size, the decoding using parity chunks may be unnecessary. If the given settings are set to erasure code aware, the reassembly of the data, if there are no erasures, is done directly by the application. The decoded or reassembled data is then transferred to an interface that is the delivery point of the decoding operation. The data may be chunked by the application when, for example, the data is large in size, such as for movies or big pictures. Such chunking by the application makes transfer over the network and the different operations more efficient. After that all the decoding operations and the reassembly of chunks is completed, the original data is in its original state, even if some backend data nodes were lost, because of the redundancy of the erasure code configuration.

In accordance with exemplary aspects of the present advancements, a novel version of a Mojette transform is used to provide a particular representation of decoded data. In the following, the term "bin" is used to denote a projection element in a Mojette transform projection. Briefly, the Mojette transform is a linear discrete exact Radon transform, in other words a set of I discrete projections describing a discrete image f. Projection angels are chosen among discrete directions $\varphi_i = \arctan(q_i/p_i)$, where the subscript i takes on integer values and $p_i$ and $q_i$ are relatively prime, i.e., the greatest common divisor is 1, GCD $(p_i,q_i)=1$. One advantage with these algorithms is that they use only addition and subtraction for the encoding and decoding operations, thereby minimizing the CPU constraints for the operations and making the application fast. ANALYSIS OF MOJETTE TRANSFORM PROJECTIONS FOR AN EFFICIENT CODING; Workshop on Image Analysis for Multimedia Interactive Services (WIAMIS, April 2004, Lisboa, Portugal. 2004. <hal-00451338>), which is incorporated herein by reference in its entirety includes the description of the Mojette transform in section 2, the selection of projections in section 3 and the selection of bins in section 4.

A first example for the projections (p,q) p1=(0,1), p2=(1,1), p3=(−1,1) shows that they are well suited for a basic Mojette configuration for storage purposes when this gives a minimum extra data for each calculated projection and has a simple reconstruction pathway. A Geometry Driven Reconstruction Algorithm for the Mojette Transform. Attila Kuba, László G. Nyúl, Kálmán Palágyi. Discrete Geometry for Computer Imagery, October 2006, Szeged, Hungary. Springer Berlin/Heidelberg, 4245, pp. 122-133, Lecture Notes in Computer Science. <10.1007/11907350 11>. <hal-00267628>, which is incorporated herein by reference in its entirety, includes the description of Mojette transform in section 2 and the geometry driven reconstruction in section 3. If on the other hand a maximum performance is needed for the decoding operation the m parity projections can be chosen to have a larger epsilon, $\varepsilon \gg 0$. Depending on the CPU to be used the maximum $\varepsilon$ can be set, and aligned m parity projections calculated, to work as a parity projection package.

A second example includes a configuration where instead of decoding one pixel for each iteration over the m parity projections, two pixels per iteration are decoded. In this erasure code configuration example, the following parameters are used: Blocksize=128, Data chunks (k)=4, Parity chunks(m)=3. For the base case the corresponding projections are (p,q) p1=(0,1), p2=(1,1), p3=(−1,1) minimizing epsilon $\varepsilon \approx 0$. When a configuration for higher performance is used, the m parity chunks are allowed to increase and the epsilon is $\varepsilon \gg 0$. The corresponding aligned parity projections are, for a case solving a minimum of two pixels per m parity projection iteration, (p,q) p1=(2,1), p2=(4,1), p3=(6,1), where the p value of the aligned m parity projections increase from p1 to p3 with the pixel step 2. When the pixel step is 5 based on the increase in $\varepsilon$ or other constraints, the aligned m parity chunk packages are (p,q) p1=(5,1), p2=(10,1), p3=(15,1). To clarify, an aligned m parity projection package is a number of parity chunks with different p values that has a minimum stable pixel step greater than one per iteration, during the stable phase of the decoding operation. The pixel step is the number of pixels possible to solve per iteration.

The decoding also divided into a minimum of two phases to support the aligned m parity projection packages. These two phases are a preamble phase and a stable phase. If necessary, a post-amble phase may be included if the block size does not even out. The post-amble phase works the same way as the preamble phase with detection of the maximum next size of the pixel step. The end of the pre-amble phase is detected when the sorted m parity projections by p value, solves the correct row, where highest p value solves the top row. The decoder uses a geometry driven reconstruction algorithm for the Mojette Transform and goes from left to right, iterating over the m parity projections to solve a maximum number of pixels per iteration during each phase of the decoding operation, the pre-amble, the stable phase, and if needed the final post-amble phase.

An example is given in Table 1 in which for the given example case the preamble phase is finalized after 13 steps and the decoder is then ready to execute the stable phase where one m parity projection is used to solve one set row in the block.

A bigger $\varepsilon$ accelerates the decoding up to a point, but $\varepsilon$ can also be increased to a point that hardware/software constraints make further acceleration impossible. Also if not using perfectly aligned m parity projection packages the decoder needs to identify the maximum number of pixels possible to solve for each iteration over the m parity projections, which can make the decoding slower. The minimum number of pixels that can be solved by a perfectly aligned m parity package during the stable phase is the p value pixel step-up between the parity projections. Depending on the configuration and data projections lost, this can be significantly different up to the point of one erasure (one data chunk lost) where a full vectorization can take place for the decoding without any phases when there is always only one pixel to solve for each bin of the m parity projection. The specific one erasure case can be seen as an example in FIG. 5 for details. In this case where a fully vectorized solution for one erasure is not available when the non-systematic Mojette transform does not have any data chunks, and has only m parity chunks for the decoding operation.

A Mojette transformation is a mathematical operation applied on a two-dimensional representation of data. As used herein, it is applied on data blocks in order to obtain an efficient data storage representation of the data. The Mojette transformation may be used as a particular way to encode a data block in order to provide a particular representation of the data block. To this end, the transform takes as input specific data that has been given a form that is suitable to encode using a Mojette transform, e.g., a data block representation. A data block is a particular sequence of information, i.e. bytes or bits, having a particular size that is commonly denoted block size. Data elements or values form part of the sequence of the data block, see e.g., the 6×3 data block illustrated in FIG. 3. When the Mojette transform is applied to the data block a number of projections are obtained. These projections furnish a particular representation of the original data. A beneficial feature obtained by using the Mojette transform is that it only requires arithmetic operations in the form of additions and subtractions. This reduces the computational demands of a CPU of a client that accesses data that has been stored in distributed storage.

The Mojette transform operator, or the Mojette projection operator, is applied to a two-dimensional representation of data. Consider the fact that a two-dimensional array, having elements representing certain information carried by the data, can be represented by a discrete function $f(k, l)$ where k and l denote discrete elements of the array, e.g., pixels or samples. In a two dimensional array these denote the columns and lines or rows, respectively.

The Mojette transform/projection operator is defined as:

$$M\{f(k,l)\} = \text{proj}(p_i, q_i, a) = \sum_{k=0}^{Q-1}\sum_{l=0}^{P-1} f(k,l)\delta(a + p_i l - q_i k)$$

$$M\{f(k,l)\} = \text{proj}(p_i, q_i, a) = \sum_{k=0}^{Q-1}\sum_{l=0}^{P-1} f(k,l)\delta(a + p_i l - q_i k) \quad \text{Equation 1}$$

The summation indices P and Q correspond to the size of the data block, i.e. the data is given a data block representation of size P×Q, a is a number that will specify the line over which the elements, or pixels, are centered. Applying the Mojette transform operator to a particular data block leads to a sum over the elements or pixels that are centered around a particular line $a = p_i l - q_i ka = p_i l - q_i k$, here the particular line can be inferred from the Kronecker delta function $\delta(a) = 1$, if $a = 0$ and 0 otherwise. In what follows a is removed from the argument in $\text{proj}(p_i, q_i, a)\text{proj}(p_i, q_i, a)$ and a projection is simply denoted by $(p_i, q_i)$. The equation (1) above can be used to generate any projection with any value of p and q. The number B of line sums, also referred to as the number of bins, per projection is given by $$B = (Q-1)|p| + (P-1)|q| + 1B = (Q-1)|p| + (P-1)|q| + 1.$$

In exemplary aspects of the present advancements, the optimal pixel step size can be calculated. One way to find the optimal pixel step is described below where q=1 and all p values are positive. In this example the input m parity chunks are P(30,1), P(25,1), P(20,1) solving three erasures.

1. Sort the m parity chunks according to their p values. Sorted p values, 30, 25, 20;

2. Calculate the difference between p for each pair of the sorted m parity chunks. The minimum of this calculation also is the minimum stable pixel step that can be used. Difference between the p values are 5, 5;

3. Calculate the pixel step factor by dividing each p value from the sorted m parity chunks by the erasure the chunk is going to solve. For example here for three erasures, the highest p value will solve the highest erasure. Then also divide with the previous found in step 2, the minimal difference between the p values. 30/(3*5)=2, 25/(2*5)=2.5, 20/(1*5)=4; and 4. Calculate the optimal pixel step by finding the minimal pixel step factor from the above m parity chunks and multiply this with the minimal pixel step previously found in step 2. This now is the maximum stable pixel step that can be used for the m parity chunks in this example. The optimal pixel step is calculated from the minimum difference from step 2 and multiplied with the minimum factor from step 4. Optimal pixel step in this example is 5*2=10.

If negative p values are also used, this calculation can be made in the same manner as for the positive. The m parity chunk P(0,1) is unique and needs to be handled separately if using above method to find the optimal pixel step from the input m parity chunks.

Examples of how projections are used in the present advancements are described in detail below.

The exemplary encoding of the data described herein also enables a quick and computationally efficient decoding of the data and also enables a highly efficient reconstruction of faulty data. If erasures occur during decoding, less than k erasures simplify the decoding work. When 1 to k−1 rows are present during decoding in an erasure mode, fewer pixels need to be calculated and restored using m projections $\text{proj}(p_i, q \neq 0)$, This allows the decoding to consume less CPU cycles, increasing decoding performance.

If, on the other hand, the number of erasures ≥k for k lost data chunks, the decoding is performed as in a standard non-systematic Mojette decoding using only m projections $\text{proj}(p_i, q \neq 0)$ for the full decoding operation. Using aligned projection packages accelerate all decoding modes either in systematic or non-systematic mode, when compared to using a minimal projection package where ε is as small as possible. Decoding operations using aligned projection packages (OPTFEC) allows optimization of operations for modern CPU's, FPGA's and GPU's.

The present advancements provide particular mechanism for both encoding and decoding data involving a particular application of two types of projections, $\text{proj}(p_i=1, q_i=0)$ and $\text{proj}(p_i, q \neq 0)$. These projections are used in a particular combination in order to achieve a highly robust encoding of the data. The exemplary encoding of the data according to the present advancements also enables a quick and computationally efficient decoding of the data, as well as enabling a highly efficient reconstruction of faulty data if such data has been detected. The present advancements provide mechanisms whereby the data decoding side can select a particular decoding scheme to use based on information provided by the encoding side, i.e., by performing a particular check on the encoded data. The encoding side and the decoding side are described separately below.

According to a first exemplary aspect of the present advancements a method for generating encoded data includes a step of obtaining data in the form of data formatted according to specified settings to comprise rows and columns. The method also comprises the step of creating, by applying an encoding transform on the obtained data block, a set of projections, proj $(p_i, q_i)$, the set of projections including a first number of projections, proj ($p_i=1$, $q_i=0$), and a second number of projections, proj ($p_i$, $q_i \neq 0$). The second number of projections, proj ($p_i$, $q_i \neq 0$), are created by applying an encoding Mojette transform on the data block. The method also comprises the step of outputting the created set of projections to enable a storage of the data in the form of the set of projections.

In slightly different words, there is provided a method that generates encoded data, such as encoded representations of data blocks. The initial, or original form of the data block is provided as input and depends on the particular formatting used. Having obtained the data block the method creates a set of projections by applying an encoding transform on the data block. The encoding transform creates two particular sets of projections. The encoding transform is based on the Mojette transform insofar that projections, proj ($p_i$, $q_i$), based on the data block are created. The present advancements uses a novel application of the Mojette transform in order to generate the first number of projections, proj ($p_i=1$, $q_i=0$) while the second number of projections, proj ($p_i$, $q_i \neq 0$) are created by applying a traditional encoding Mojette transform on the data block. The number of second projections, also referred to as redundancy projections or m-projections, or m parity chunks, may be any number that can be obtained by specifying the indices in proj ($p_i$, $q_i \neq 0$), e.g. (1, 1), (1, 2), (1, 3), (2, 1), (2, 2) etc. Hence a large number of redundancy projections may be generated to safeguard the data. The particular step of creating the first number of projections, proj ($p_i=1$, $q_i=0$), includes, for example, mapping each row of the data block to a corresponding projection, proj ($p_i=1$, $q_i=0$). This creates projections that carry the same information as a corresponding row. Having created the first and second number of projections the method outputs the created set of projections to enable a storage of the data in the form of the set of projections or parity and data chunks. A client accessing the encoded data may now decode the data according to a proposed decoding mechanism described below.

The projections, proj ($p_i=1$, $q_i=0$), having q=0 have different properties than projections having q≠0 when they have no additional information of the rows. Thus, the proj(1,0) is also identified as a q=0-projection and is very similar to a chunk in standard applications containing a header that indicates some parameters for the application like, e.g., size or some other parameter, which can be used by the application for, e.g., identification, and can also be used together with, and fully integrated into, a Mojette transform environment along with other projections. These q=0-projections, or data chunk projections, herein identified as q=0 or proj(1,0) projections, can be treated separately since they do not carry any extra redundancy information like the q≠0 projections do. They, therefore, need separate attention with respect to data corruption when used alone, i.e., without any q≠0 projections present during the decoding operation. This is due to the fact that there is no way to verify that the end result is correct without $q_i \neq 0$ projections present. An error with respect to the encoding may be detected by verifying that all bins that have been emptied during the decoding and that each of the bins after the decoding is zero (0), but without the $q_i \neq 0$ projection(s) present during the decoding this is not possible to perform. Having a bin≠0 after decoding provides an indication that an error has occurred during the encoding of the data and new $q_i \neq 0$ projections are needed to exchange a faulty projection before the renewed decoding and verification of the decoded data can take place.

Moreover, the $q_i=0$ projections also have different properties compared with the $q_i \neq 0$ projections when it comes to computations. The first difference is that the q=0 projections have the original size, i.e., the number of pixels in the q=0 projections have the same number of pixels as the original rows of the data block. They are also less computation intensive to calculate since a smaller amount of calculations are needed when performing both encoding and decoding. These properties allow for a reduced computational effort during both encoding and decoding operation and as a consequence make the proposed encoding mechanism, referred to herein as OPTFEC, faster. The method, however, also creates a second number of projections, proj ($p_i$, $q_i \neq 0$). This may be done by applying an encoding Mojette transform on the data block. The second number of projections provides redundancy projections that can be used to decode the data block if at least one of the first set of projections contains an erasure or has been erroneously encoded. The second number of projections, with $q_i \neq 0$, may thus be created by applying a traditional Mojette transform on the data block. In the end, the different projections together provide a particular representation of the encoded data that allow for a highly efficient decoding where erasure of data or erroneously encoded data swiftly, i.e., with a reduced number of computations, can be correctly reconstructed.

A procedure according to exemplary aspects of the present advancements may be performed as follows. In step 1, the settings from the application together with settings for the method, i.e. OPTFEC, is received. The settings are used to set the erasure code to the performance, redundancy and durability that the application and user has requested. In Step 2, the erasure code receives input data to be transformed into k+m projections. The input data and the settings from step 1 and step 2 are both fed into the encoder interface in step 3. In step 4 the input data is formatted according to the settings given in step 1, thereby creating k number of rows of the data and a number of columns calculated as: Columns=Block size/rows. In Step 5, the encoding or transformation of the data takes place to create k number of $q_i=0$, i.e. proj(1,0), projections and m number of redundancy projections q≠0, i.e. proj($p_i$, q≠0). For the $q_i=0$ projections there are no standard bins according to Mojette transform. Instead the whole row is saved as a projection.

The created projections have different sizes depending on number of rows and projection angle for the given block and projections. In step 6, the different projections having qi=0 and $q_i \neq 0$ are identified in a way that is suited for later transmission to the application or client. In Step 6, the encoded data is sent as output from the encoder to be stored by the application on preferred backend where k=proj(1,0) and m=proj($p_i$,q≠0) projections.

Below is a detailed description of the decoding side of the present advancements. A method for decoding data uses a dual decoding mode. The method includes a step of acquiring settings. The settings comprise a number k of data fragments and, optionally, a number m of parity fragments together with information about whether erasure code aware mode is active. The settings may further comprise the block size, or packet size b, the matrix size and information about the input file from the application to be encoded. Other parameters may be included as would be recognized by one of ordinary skill. The method also includes the step of obtaining encoded data. The encoded data is encoded by applying an encoding transform on a data block formatted according to the settings, the encoded data comprises a set of projections, proj($p_i$, $q_i$), the set comprising a first number of projections, proj ($p_i=1$, $q_i=0$), and a second number of projections, proj($p_i$, $q_i\neq 0$)). The method also includes the step of checking whether the first number of projections, proj ($p_i=1$, $q_i=0$), is equal to the number k of data fragments. The method selects, based on the checking, a decoding mode to use for decoding the data, where the decoding mode is either a no-erasure decoding mode or an erasure decoding mode. The method also includes the step of decoding the data utilizing the selected decoding mode in order to reconstruct, or recreate, the data block.

The dual decoding mode described herein includes a first decoding mode that is a no-erasure mode, and a second decoding mode that is an erasure decoding mode. The proposed method comprises sub steps to determine which of the dual decoding modes to use for a particular encoded data. The method then uses the determined decoding mode to decode the data. Initially, the method acquires the settings used when encoding the data. The settings may be acquired as part of the information obtained when the encoded data is retrieved. The settings may also be predetermined settings or acquired in some other way without departing from the scope of the present advancements. The settings generally include information about at least the number k of data fragments, but may also include the number m of parity fragments, and the block size, or packet size, of the encoded data. The block size may be used to determine either the number of columns or the number of rows of the data block based on the relation: Columns=Block size/rows. Herein the number k denotes the number of data fragments or data chunks for proj(1,0) projections and it also provides a measure for the minimum number of projections needed to be able rebuild the block. The value k may also denote the number of rows in the OPTFEC block. The number m referred to above denotes the number of parity fragments for OPTFEC proj($p_i$, $q_i\neq 0$) projections, and specifies the maximum number of projections that can be lost while still enabling the proposed method to rebuild or reconstruct the data block, i.e., it provides a measure of the redundancy of the system. To clarify, in order to be able to rebuild or reconstruct the original data block a total number of k projections are needed. These k projections do not have to be the k original proj(1,0) projections, but can be a combination of a particular number of the original proj(1,0) projections and a particular number of the proj($p_i$, $q_i\neq 0$) projections. Consider for simplicity the case where k=4 and m=8, here 8 projections can be lost or erased and a reconstruction is still possible, if on the other hand all, or a subset, of the k original proj(1,0) projections are lost, a reconstruction can be made by utilizing the corresponding set or subset of the m proj ($p_i$, $q_i\neq 0$) projections. The present advancements therefore provide a large number of possibilities of combining k and m projections in order to reconstruct an erroneous data block.

Having obtained the settings, the method obtains, or receives, the encoded data. The data may be encoded as described above relative to the method for generating encoded data and as such includes a set of projections. The obtained or received set of projections include the two different sets of projections, of which the first comprises the first number of projections, proj ($p_i=1$, $q_i=0$), and the second comprises the second number of projections, proj($p_i$, $q_i\neq 0$). The method checks whether the obtained number of first projections is equal to the number k acquired with the settings. Based on whether the equality holds or not, the method selects the particular decoding mode to use for the decoding of the data. For example, the method includes the step of selecting a decoding mode by selecting a no-erasure decoding mode if the first number of projections, proj ($p_i=1$, $q_i=0$), is equal to the number k of data fragments. The step of selecting a decoding mode may also include selecting an erasure decoding mode if the first number of projections, proj ($p_i=1$, $q_i=0$), is less than the number k of data fragments.

By way of example, the exemplary method also includes the step of decoding the data by utilizing the erasure decoding mode includes the further step of controlling whether the set of obtained Mojette projections, proj ($p_i$, $q_i$), are enough for decoding the data block. For example, the method in the step of controlling may also include determining whether the obtained first number of projections, proj ($p_i=1$, $q_i=0$), plus the obtained second number of projections, proj($p_i$, $q_i\neq 0$) is equal to, or larger, than the number of rows of the data block.

In one exemplary aspect, the method also includes the step of requesting further Mojette projections proj($p_j$,$q_j$) if the obtained first number of projections, proj ($p_i=1$, $q_i=0$), plus the obtained second number of projections, proj($p_i$, $q_i\neq 0$) is smaller than the number of rows of the data block. The further Mojette projections proj($p_j$,$q_j$) are different from the first number of projections, proj ($p_i=1$, $q_i=0$), and the second number of projections, proj($p_i$, $q_i\neq 0$). In this exemplary aspect, the method may decode the data block by using the first number of projections, proj ($p_i=1$, $q_i=0$), the second number of projections, proj($p_i$, $q_i\neq 0$) and the requested further Mojette projections proj ($p_j$,$q_j$).

Further exemplary aspects include a method in which the step of decoding also includes determining whether the data has been correctly decoded by checking whether the bins of the decoded data are equal to zero.

The method may also reconstruct encoded data including erasure without the erasure by utilizing the at least one of the obtained second number of projections, proj($p_i$, $q_i\neq 0$). That is, the method may reconstruct an erroneously encoded data, i.e. data block, by utilizing the redundant, or extra, information comprised in the obtained second number of projections, proj($p_i$, $q_i\neq 0$). That the second number of projections comprises redundant, or extra, information is the reason they are referred to as redundancy projections herein.

The decoding method may thus decode data by selecting a particular decoding mode to use. The particular decoding mode that is selected may utilize the redundancy projections to correctly, i.e. without the erasure, reconstruct the initially encoded data block.

In an example, the decoding method, i.e., the OPTFEC method, decodes data from a number of projections that were generated as described above. The OPTFEC method receives the input projections and the settings from an application. The projections can be check-summed by the application, or the OPTFEC method may perform the check sum. The check sum is performed in order to detect, as early as possible, whether corrupt data is received. This enables the decoding client to call for new data or request a retransmit if the check sum reveals that the received data is corrupted.

Then the method checks to determine whether the number of proj(1,0) projections are equal to the setting k received. If the number of proj(1,0) projections are equal to k then these projections, proj(1,0), can be used to rebuild or reconstruct the block directly. This is referred to as the no-erasure mode. If the number of projections, proj(1,0), is less than k, a dual decoding operation is required, i.e. the erasure decoding mode. These two different modes of operations, no-erasure mode and erasure mode, are also referred to as the dual operation mode.

Next the method rebuilds the block using the proj(1,0) projections. The method tests if the number of projections received are enough for the rebuild of the block or if more projections needs to be called for. If m+k≥rows, there are enough projections available for performing a decoding in order to recreate or reconstruct the original data. If the m+k is less than number of rows then there are not enough available projections for the rebuild of the original data to take place. Accordingly, the method may request more projections by, for example, sending a signal to the application. To clarify, in order to be able to rebuild or reconstruct the original data block a total number of k projections are needed. These k projections do not have to be the k original proj(1,0) projections but can be a combination of a particular number of the original proj(1,0) projections and a particular number of the proj($p_i$, $q_i$≠0) projections. Consider for simplicity the case where k=4 and m=8, here 8 projections can be lost or erased and a reconstruction is still possible, if on the other hand all the k original proj(1,0) projections are lost a reconstruction can be made by utilizing the m proj($p_i$, $q_i$≠0) projections. The present advancements therefore provide a large number of possibilities of combining k and m projections in order to reconstruct an erroneous data block. If there is no such combination at hand a signal may be sent to request further projections. These further projections may, e.g., be proj($p_i$, $q_i$≠0) projections with higher values of $p_i$ and $q_i$. A request is placed to ask if there are more redundancy projections available for the rebuild to take place. If there are no more projections available, an error message may be outputted to the application. The decoding of the projections received is performed to recreate the original data. The output is checked to verify that the output data is correct. If Bins=0 then the data is correct. If on the other hand not all Bins are equal to 0 a request for more projections the data is not correct. If the data is correct, it is output to the application/client of the rebuilt or reconstructed data is performed. Here an alignment can also be made to present the data in a correct way to the application/client.

In another example of OPTFEC encoding of data, the data is formatted with the settings k=3 m=2 and block size=18. The input data formatted to the block according to given settings. The block is used to generate projections having q=0. Since k=3 three projections proj(1,0) are produced, one for each of row 1 to row 3, and the handling of the pixels in each row is treated as traditional sums of pixels in Bins as in projections having q≠0. Two redundancy projections are produced when the input settings states that m=2 in this example. From the OPTFEC setting set by the application and indicating that proj(2,1) and proj(−2,1) should be produced, proj(2,1) is created and proj(−2,1). All projections are displayed showing that m+k=5 and that proj(2,1) and proj(−2,1) are 4 Bins longer than the corresponding proj(1,0). Here a total of 5 projections are produced, three (3) for q=0 and two (2) for redundancy q≠0 in accordance with the input requirement k=3 m=2.

In an example of decoding a block using projections proj(1,0), the total number of projections having proj(1,0) equal the setting input k also correspond to the number of rows in the block to be rebuilt. An empty block corresponding to the given settings for the encoding of the data is provided. In this example k=3 and m=2 with the block size=18 giving 3 rows and 6 pixels in each row. According to the method, the number of projections having q=0 is equal to k. Thus, the next step is the building of the block. For projections having q=0 the p represents the row that corresponds to where the data should be inserted. The value of proj(1,0) is inserted into row one, the value of proj(1,0) for row two is inserted into row two and the value of proj(1,0) for row three (3) is inserted into row number three, rebuilding the block. A fully rebuilt block is the shown having 3 rows rebuilt using three projections having q=0.

The rebuilding of the block when there is erasure present and when there is a loss of one row r2 that needs to be rebuilt using a projection not having q=0 is explained next. The application provides 3 projections for the erasure to rebuild the block given the settings k=3 and m=2 block size=18. It is determined whether the number of projections having q=0 is less than k. In this case the number of projections having q=0 is not less thank. Therefore, the method determines that m+k=3, which indicates that decoding is possible. A detailed example of how this erasure decoding is performed with the projections proj(1,0), proj(−2,1) is described next. An empty block is provided that corresponds to the given settings for the encoding of the data. In this example k=3 and m=2 with the block size=18 (3 rows and 6 pixels in each row r1, r2, r3). The value of proj(1,0) is inserted into row one (r1), and the projection proj(1,0), corresponding to row three (r3), is inserted into row number three (r3). Row two (r2) is empty, and the third projection proj(−2,1) is needed for decoding. In step 530 the projection proj(−2,1) is introduced and from these bins a subtraction of the already filled in pixels is performed to rebuild row two (r2). Using projection proj(−2,1) the already filled in pixel is 7 and by subtracting this pixel from the first bin a 0 is created. That is, 7−7=0. The S2 the projection is 4 from already present pixels and this then gives 4 from the projections bin minus the 4 from the present projections in the block and subtracting the two gives zero, 4−4=0. Using the same procedure result in: 11−2=9, 2−1=1, 14−2−9=3, 16−3−8=5, 12−5=7, 11−7=4, 4−4=0, 3−3=0, giving the output from the decoding show, i.e. [0 0 9 1 3 5 7 4 0 0]. For the given projection proj(−2,1) and k=2, m=2 and block size 18 it is pixel 3 to 8 that solves the r2=(9, 1, 3, 5, 7, 4). After this decoding operation the block is reconstructed using Mojette decoding.

According to an exemplary aspect, the method may be supplemented with a Cyclic Redundancy Check, CRC, performed on the initial or original data block. Ensuring that the initial data block does not contain corrupted data increases the efficiency of the method whereby the data is subject to the Mojette transform to obtain multiple Mojette transform projections ($p_i$,$q_i$). Thus, in exemplary aspects, the method further includes performing a CRC on the initial data, and the method only applies the Mojette transform on the data block if the CRC sum is correct. This ensures that a client does not need to perform a Mojette decoding on the data if the data is corrupted, increasing efficiency.

The method can also be supplemented with a Streaming SIMD Extensions (SSE) extension for the acceleration of encoding and decoding operations. This embodiment can also use programmable hardware devices to accelerate the encoding and decoding operation, such as field-programmable gate array (FPGA). Having aligned parity projection packages present, a very efficient SSE accelerated vectorized code can be created that greatly reduces the number of CPU cycles necessary for the decoding process when an erasure is present. The same is also true for the implementation on FPGA or Graphics Processing Unit (GPU) where even more cores can work in parallel to simultaneous solve the decoding effort when an erasure is present.

The following are examples of an aligned m parity chunk package using the following configuration settings for the encoding and decoding operations. Encoding configuration: Blocksize=64, Data chunks (k)=4, Parity chunks(m)=3, Parity projections (p,q) p1=(2,1), p2=(4,1), p3=(6,1)

This encoding is performed using Mojette Transform for the above given encoding configuration.

Decoding: Data chunk for row 1, 2, and 4 are lost and the operation is in erasure mode, and the following m parity projections are used p1=(2,1), p2=(4,1), p3=(6,1) and the k data chunk for row 3 to be used for the rebuild of the data.

Table 1 below shows the first 13 steps of the preamble phase (unstable) decoding operation where 3 k data chunks are lost and 3 m parity chunks used to replace de lost data chunks during the decoding operation.

TABLE 1

Preamble phase (unstable)

| Step | Projection | Position/Pixels | Solved row | Right/Wrong |
|---|---|---|---|---|
| 1 | P(2, 1) | 1 and 2 | 1 | W |
| 2 | P(4, 1) | 3 and 4 | 1 | W |
| 3 | P(6, 1) | 5 and 6 | 1 | R |
| 4 | P(2, 1) | 17 and 18 | 2 | W |
| 5 | P(4, 1) | None | — | W |
| 6 | P(6, 1) | 7 and 8 | 1 | R |
| 7 | P(2, 1) | 19 and 20 | 2 | W |
| 8 | P(4, 1) | None | — | W |
| 9 | P(6, 1) | 9 and 10 | 1 | R |
| 10 | P(2, 1) | None | — | W |
| 11 | P(4, 1) | 21 and 22 | 2 | R |
| 12 | P(6, 1) | 11 and 12 | 1 | R |
| 13 | P(2, 1) | 49 and 50 | 4 | R |

An iteration over each m parity chunk is made, here in the order P(2,1), P(4,1), P(6,1) and the table shows column one the first iteration step. In column two the m parity chunk used, in column three the solved pixels, in column 4 the row where the solved pixels belongs to, and in column 5 if this is the correct row to solve for the m parity projection used during this iteration step Right or Wrong is indicated. The end to the preamble phase, indicating R or W in column 5 in Table 1, is reached when each m parity chunk solves the correct row given by the p value of the m parity chunk and the row number when sorted by size. This is indicated in Table 1 at steps 11, 12, and 13. The sorting can be done ascending or descending depending on preferences, but in this example the top row is the highest and the bottom the lowest.

What characterizes this the preamble (unstable) phase is that as shown in Table 1 not all iterations will solve pixels as here in step 5, 8, and 10. For an ideal situation as in the later stable phase, described below, the number of aligned pixels given by the configuration can be solved in each iteration.

The different phases in the decoding operation where the phase between 1 and 2 is the unstable preamble phase and 2 to 3 is the stable and here not shown 3-end is the post-amble phase. Table 1 illustrates for the second example the preamble phase and identified why this is the unstable phase where the correct number of pixels and the correct row is not always solved correctly during each iteration over the m number of parity chunks.

Table 2 shows the decoding operations during the stable phase solving in this example the number of aligned pixels per iteration step 14 to 19.

TABLE 2 for the stable phase iterations

| Step | Projection | Position/Pixels | Solved row | Right/Wrong |
|---|---|---|---|---|
| 14 | P(4, 1) | 23 and 24 | 2 | R |
| 15 | P(6, 1) | 13 and 14 | 1 | R |
| 16 | P(2, 1) | 51 and 52 | 4 | R |
| 17 | P(4, 1) | 25 and 26 | 2 | R |
| 18 | P(6, 1) | 15 and 16 | 1 | R |
| 19 | P(2, 1) | 53 and 54 | 4 | R |

When comparing Table 1 to Table 2, column 5 Right/Wrong in Table 2 is stable, i.e., always R, and the used m parity chunk in the iteration solves the correct row in the matrix each time making the decoding operation very efficient and simple. The stable phase between 2 and 3 for the second example iteration over the m number of parity chunks illustrate that this is the stable phase where each iteration or step solves at minimum the aligned number of pixels and the sorted m parity chunks solves the sorted correct row.

Next, encoding/decoding of multiple pixels is explained. In these explanations, the multiple pixels per iteration solutions employ aligned m parity projection packages. For example, an exemplary layout of m parity chunk P(2,1) includes pixel positioning depending on the matrix layout as discussed above relative to FIG. 6a, FIG. 6b and the bin id number and the actual bin. The top row indicates the bin identification (id) number from left to right, starting from 1 and ending with 22. Below the bin id number row is a representation of the m parity chunk P(2,1) where each row in the matrix is moved two steps to the right based on the p value of P(2,1) m parity chunk. The bins are then calculated by summing each bin id number column down, shown as the Sum Bin row from bin id number 1 to 22. The bin id numbers 1 and 2 have different properties than the bin id numbers 3 to 20 and this pattern repeats for bin id numbers 21 and 22. The first 2 and the last 2 bin id numbers are free and do not depend on any other k data chunk or m parity chunk. These bin id numbers are solved on their own. This feature advantageously allow for direct transfer of the data from that pixel position directly into the data matrix. In this case the values in these pixel positions, 1 and 2 and 63 and 64, are directly transferred to the solution data matrix. When this data is transferred to the solution data matrix, each m parity chunk must be updated. In this example, the information for pixels 1, 2, 63 and 64 is updated by subtracting the information in the pixels 1, 2, 63 and 64 from the respective pixel position in each bin containing these pixel positions, for the other m parity chunks.

In the above, an m parity chunk package is aligned to solve minimum two pixels per iteration depending on number of erasures and data chunk or m parity chunk that was lost. Here, P(2,1) contains 2+2 free pixels, P(4,1) contains 4+4 free pixels and P(6,1) contains 6+6 free pixels. The respective m parity chunk graphical representations has moved the rows to the right given by the p value of the m parity chunk as explained in detail for a negative p value in this example the rows are moved to the left by the p value of the m parity chunk. Aligned m parity chunk packages to solve multiple pixels per iteration over each m parity chunk during a decoding operation, can be set up to use both all positive p values, positive and negative and all negative, where the minimum absolute m parity chunks p value will denote the maximum number of pixels that can be solved during a stable phase with the same number of pixels solved per iteration, given that the m parity chunks with the minimum values are used for the decoding operation.

The status of the m parity chunk package in the second example is the data after the preamble phase is finished. This is also shown in Table 1. Here the zeros represent already solved pixel positions, and P(4,1) m parity projection contains two free pixel positions 23 and 24.

As can be appreciated, this step solves pixels 23 and 24 and frees two pixels in m parity chunk P(6,1) pixel positions 13 and 14 that now can be solved using the same procedure. The described procedure moves from left to right, but the procedure can also move from right to left, or move from both directions at once without departing from the scope of the present advancements. Thus, orientation of the matrix and the direction of the solution is fully flexible.

Next apparatuses according to exemplary aspects are described. As can be appreciated, the above described methods may be performed by these apparatuses without limitation.

As can be appreciated, the methods described herein can be implemented, combined and re-arranged in a variety of ways without departing from the present advancements. For example, embodiments may be implemented in hardware, or in software for execution by suitable processing circuitry, or a combination thereof. The steps, functions, procedures and/or blocks described herein may therefore be implemented in hardware using any conventional technology, such as discrete circuit or integrated circuit technology, including both general-purpose electronic circuitry and application-specific circuitry. Alternatively, or as a complement, at least some of the steps, functions, procedures and/or blocks described herein may be implemented in software such as a computer program for execution by suitable processing circuitry such as one or more processors or processing units. Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device in which the proposed technology is implemented. It may also be possible to re-use existing software, e.g. by reprogramming of the existing software or by adding new software components.

In exemplary aspects of FIGS. 1a, 1b, 1c, and 1d, the present advancements also include an apparatus 100 for generating encoded data. The apparatus 100 is configured to obtain data in the form of a data block formatted according to specified settings to comprise rows and columns. The apparatus 100 is also configured to create, by applying an encoding transform on the obtained data block, a set of projections, proj $(p_i, q_i)$, the set comprising a first number of projections, proj $(p_i=1, q_i=0)$, and a second number of projections, proj $(p_i, q_i \neq 0)$, the second number of projections proj $(p_i, q_i \neq 0)$ being created by applying an encoding Mojette transform on the data block. The apparatus 100 is further configured to output the created Mojette projections to enable a storage of the data in the form of the Mojette projections.

The apparatus 100 may also be configured to create a set of projections, proj $(p_i, q_i)$, and may be configured to create the first number of projections, proj $(p_i=1, q_i=0)$, by mapping each row to a corresponding projection, proj $(p_i=1, q_i=0)$, in order to create projections carrying the same information as a corresponding row.

Another embodiment of the apparatus comprises an apparatus 100 that is configured to create a set of projections, proj $(p_i, q_i)$, and may be configured to create the second number of projections proj $(p_i, q_i \neq 0)$ by applying an encoding Mojette transform on the data block, the second number of projections providing redundancy projections to be used to decode the data block if at least one of the first set of projections contains an erasure or has been erroneously encoded.

The apparatus 100 may also include a communication circuit 130. The communication circuit 130 may include functions for wired and/or wireless communication with other devices in a network. In a particular example, the communication circuit 130 may be based on radio circuitry for communication with one or more other nodes, including transmitting and/or receiving information. Wired communication, i.e. exchange of data over a wired network, is however equally possible. The communication circuit 130 may be interconnected to the processor 110 and/or memory 120. The communication circuit 130 may be interconnected to a hardware circuitry 110. By way of example, the communication circuit 130 may include any of the following: a receiver, a transmitter, a transceiver, input/output (I/O) circuitry, input port(s) and/or output port(s).

An apparatus 200 may be configured to decode data by utilizing a dual decoding mode. The apparatus 200 is configured to acquire settings that include a number k of data fragments and a number m of parity fragments. The settings can also include the block size, packet size, of the encoded data. The apparatus 200 is also configured to obtain encoded data, encoded by applying an encoding Mojette transform on a data block formatted according to the settings. The encoded data includes a set of Mojette projections, proj $(p_i, q_i)$, and the set includes a first number of projections, proj $(p_i=1, q_i=0)$, and a second number of projections, proj$(p_i, q_i \neq 0)$. The apparatus 200 is also configured to check whether the first number of projections, proj $(p_i=1, q_i=0)$, is equal to the number k of data fragments. The apparatus 200 is also configured to select, based on the check, a decoding mode to use for decoding the data, the decoding mode being either a no-erasure decoding mode or an erasure decoding mode. The apparatus 200 is further configured to decode the data utilizing the selected decoding mode in order to recreate the data block.

The apparatus 200 may also be configured to select a decoding mode by being configured to select a no-erasure decoding mode if the first number of projections, proj $(p_i=1, q_i=0)$, is equal to the number k of data fragments. The apparatus 200 may also be configured to select a decoding mode by being configured to select an erasure decoding mode if the first number of projections, proj $(p_i=1, q_i=0)$, is less than the number k of data fragments. The apparatus may also investigate whether the set of obtained Mojette projections, proj $(p_i, q_i)$, are enough for decoding the data block.

The apparatus 200 can be configured to investigate whether the set of obtained Mojette projections, proj $(p_i, q_i)$, are enough for decoding the data block by determining whether the obtained first number of projections, proj $(p_i=1, q_i=0)$, plus the obtained second number of projections, proj$(p_i, q_i \neq 0)$ is equal to, or larger, than the number of rows of the data block. The apparatus 200 may also request further Mojette projections proj$(p_j, q_j)$ if the obtained first number of projections, proj $(p_i=1, q_i=0)$, plus the obtained second number of projections, proj$(p_i, q_i \neq 0)$ is smaller than the number of rows of the data block, the further Mojette projections proj($p_j$,$q_j$) being different from the first number of projections, proj ($p_i$=1, $q_i$=0), and the second number of projections, proj($p_i$, $q_i$≠0).

The apparatus 200 can also decode the data block by using the first number of projections, proj ($p_i$=1, $q_i$=0), the second number of projections, proj($p_i$, $q_i$≠0) and the requested further Mojette projections proj($p_j$,$q_j$). The apparatus 200 determines whether the data has been correctly decoded by checking whether the bins of the decoded data is equal to zero.

The apparatus 200 includes at least one processor 210 and memory 220, the memory 220 comprising instructions, which when executed by the at least one processor 210, cause the at least one processor 210 to decode data by utilizing a dual decoding mode. The apparatus 200 may also include communication circuitry 230 as described above.

Figure 1B:
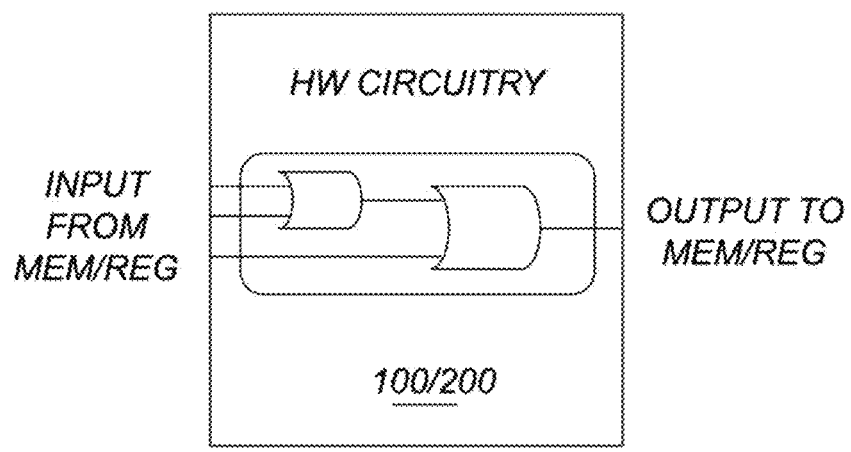
FIG. 1b illustrates a schematic of the hardware of the apparatus according to exemplary aspects of the present disclosure.

The methods described herein may implemented by apparatuses 100 and 200 that are based on a hardware circuitry, as illustrated in FIG. 1b, for example. The hardware circuitry may include Application Specific Integrated Circuits (ASICs), Field Programmable Gate Arrays (FPGAs), or any other hardware logic, such as discrete logic gates and/or flip-flops interconnected to perform specialized functions in connection with suitable registers (REG) and/or memory circuits (MEM).

In another example, at least some of the steps, functions, procedures, modules and/or blocks described herein are implemented in a computer program 125 or 135, which is loaded into the memory 120 for execution by processing circuitry including one or more processors 110. The processor(s) 110 and memory 120 are interconnected to each other to enable normal software execution. An input/output device 140 may also be interconnected to the processor(s) 110 and/or the memory 120 to enable input and/or output of relevant data such as input parameter(s) and/or resulting output parameter(s). The term 'processor' includes any system or device capable of executing program code or computer program instructions to perform a particular processing, determining or computing task. The processing circuitry including one or more processors 110 is thus configured to perform, when executing the computer program 125 or 135, well-defined processing tasks such as those described herein. The processing circuitry does not have to be dedicated to only execute the above-described steps, functions, procedure and/or blocks, but may also execute other tasks.

For example, computer program 125 or 135 may be a processor to at least:

read data in the form of a data block formatted according to specified settings to comprise rows and columns;

create, by applying an encoding transform on the obtained data block, a set of projections, proj ($p_i$, $q_i$), the set comprising a first number of projections, proj ($p_i$=1, $q_i$=0), and a second number of projections, proj ($p_i$, $q_i$≠0), the second number of projections proj ($p_i$, $q_i$≠0) being created by applying an encoding Mojette transform on the data block;

output(S3) the created Mojette projections to enable a storage of the data in the form of the Mojette projections.

By way of example, the software or computer program 125 or 135 may be stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

In another example, at least some of the steps, functions, procedures, modules and/or blocks described herein are implemented in a computer program 225 or 235, which is loaded into the memory 220 for execution by processing circuitry including one or more processors 210. The processor(s) 210 and memory 220 are interconnected to each other to enable normal software execution. An input/output device 240 may also be interconnected to the processor(s) 210 and/or the memory 220 to enable input and/or output of relevant data such as input parameter(s) and/or resulting output parameter(s). The term 'processor' includes a general sense as any system or device capable of executing program code or computer program instructions to perform a particular processing, determining or computing task. The processing circuitry including one or more processors 210 is thus configured to perform, when executing the computer program 225 or 235, well-defined processing tasks such as those described herein. The processing circuitry does not have to be dedicated to only execute the above-described steps, functions, procedure and/or blocks, but may also execute other tasks.

For example, the computer program 225 or 235 may cause a processor to at least:

read settings, the settings comprising a number k of data fragments and a number m of parity fragments, the settings further comprises the block size, packet size, of the encoded data;

read encoded data, the encoded data being encoded by applying an encoding Mojette transform on a data block formatted according to the settings, the encoded data comprises a set of projections, proj ($p_i$, $q_i$), the set comprising a first number of projections, proj ($p_i$=1, $q_i$=0), and a second number of projections, proj($p_i$, $q_i$≠0);

check whether the first number of projections, proj ($p_i$=1, $q_i$=0), is equal to the number k of data fragments;

select, based on the check, a decoding mode to use for decoding the data, the decoding mode being either a no-erasure decoding mode or an erasure decoding mode; and decode the data utilizing the selected decoding mode in order to recreate the data block.

The software or computer program 225 or 235 may be stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

Before providing detailed descriptions of various embodiments of the proposed technology it may be beneficial to provide some relevant background to the proposed technology and the potential use of the same in applications with distributed data storage. There is a great need for a high performance FEC code for distributed data storage over non perfect networks. Preferably such a code should be adapted for widely distributed storage solutions whereby end-to-end data integrity can be achieved. The code should preferably also provide for a secure and robust way to reconstruct faulty encoded data. The paper by David Fiala, Frank Mueller, Christina Engelmann, Rolf Riesen, Kurt Ferreira, Ron Brightwell, "Detection and Correction of Silent Data Corruption for Large-Scale High-Performance Computing", published in SC '12 Proceedings of the International Conference on High Performance Computing Networking, Storage and Analysis, Article No. 78 discusses that such data faults have become the norm for high-end computing clusters. The paper further discloses that even a single error can have profound effects on applications by causing a cascading pattern of corruption, which in most cases spread to other processes.

There is also a growing interest to reduce the repair efforts in distributed systems and a number of ideas is based on combinations of two or more erasure codes having different properties. One example of this is "Mojette transform based LDPC erasure correction codes for distributed storage systems" Suayb Arslan, Benoit Parrein, Nicolas Normand. Mojette transform based LDPC erasure correction codes for distributed storage systems. 25th Signal Processing and Communications Applications Conference (SIU), May 2017, Antalya, Turkey. 〈 10.1109/SIU.2017.7960333. 〈 hal-01583270, which is incorporated herein by reference in its entirety. In this paper the authors show that they can by combining the LDPC erasure code with Mojette to reduce the rebuild effort for distributed systems. If instead using the fully Mojette Transform based RRE erasure code that creates a highly improved functionality, usability and simplicity together with reduced risk when the LDPC is build upon probability calculations and not exact mathematics, this reduces the usability to systems that have built in error detection systems like TCP/IP network applications.

Pyramide codes is also a way to reduce the repair cost for failures and in this paper "PYRAMID CODES:FLEXIBLE SCHEMES TO TRADE SPACE FOR ACCESS EFFICIENCY IN RELIABLE DATA STORAGE SYSTEMS" Cheng Huang, Minghua Chen, and Jin Li Microsoft Research, Redmond, USIEEE NCA, Boston, July 2007, which is incorporated herein by reference in its entirety, presents pyramid codes as a way to reduce rebuild costs. The RRE-LR is an Mojette Transform based erasure code scheme that will outperform and simplify any pyramid code used for distributed systems when MT is functional to handle all encoding and decoding operation with little additional overhead compared to any other erasure code.

In another paper the authors state why to rethink erasure code "Rethinking erasure codes for cloud file systems: minimizing I/O for recovery and degraded reads," O Khan, R C Burns, J S Plank, W Pierce, C Huang FAST, 20, which is incorporated herein by reference in its entirety. A citation from this paper states "Several open problems remain with respect to optimal recovery and degraded reads. While our algorithm can determine the minimum number of symbols needed for recovery for any given code, it remains unknown how to generate recovery-optimal erasure codes." there is a great need for the RRE based on MT Transform where the RRE parts can be included into the application as parts or as combinations to archive optimal conditions for the specific application.

Storage servers today have large capacities to store data and the intense use of social and surveillance data boosts this need for high availability and distributed storage at low cost. Smaller devices, such as phones, smartphones, tablets and IoT devices, also have a need for higher and higher performance when they generate more and more data to be transferred to stable storage in the cloud or into a private DC.

Data loss in any application is unacceptable and this drives the DC to secure the data by replication to other storages or DCs to, thereby, always have copies of the data. This makes it possible to reconstruct the data if data or storage is lost due to any type of circumstance. Replication is, however, suboptimal when handling large amount of data since all data has to be transferred and replicated in full if a node is lost. The amount of data in a replication environment is also normally a factor 3 to 7 times the original data due to the above needs for security and having the data distributed around the globe or between offices.

The introduction of erasure coding techniques, such as Reed-Solomon, has greatly improved the situation within DCs. In these situations replication is substituted by RAID, thereby reducing the need for storage capacity by a factor 3 to 5, resulting in cost, environmental, maintenance and safety benefits within the DCs.

In today's erasure code libraries, an industry standard has been established to give different setting parameters a standard name making the integration of different libraries easier into applications. In the following examples we will use some of these standards. To this end:

In what follows k will denote the number of data fragments or data chunks for proj(1, 0) projections and also denote the minimum number of projections for to rebuild the block, and the number of rows in the block.

In what follows m will denote the number of parity fragments or parity chunks for $\text{proj}(p_i, q_i \neq 0)$ projections.

In what follows lr will denote the number of parity fragments having SBPC from a RRE-LR configuration or parity chunks for $\text{proj}(p_i, q_i \neq 0)$ projections, for the rebuilding or reconstruction of associated data.

The redundancy of the system is the combination of m and lr parity chunks for the rebuild after failures, of the original data.

Moreover, packet size={bytes} or only b will denote the block-size or file size, giving the size of the matrix FIGS. 2b and 2c to used in encoding and decoding of data according to the proposed technology.

The Reed-Solomon erasure code also has a standard implementation where the data generating application is using the non-erasure situation to be able to read and verify data all the way out on the backend storage node. The data generating application then also handles all the calls for data and parity chunks and detects if there is no erasure present and then in the application itself makes the reassembly of the data from the data chunks. If however there is a data chunk missing the received number of data chunks together with the necessary number of parity chunks is delivered to the erasure code decoding interface for a decoding operation. This erasure code aware implementation of erasure code can be further studied for the Reed-Solomon library from Intel "Intel® Intelligent Storage Acceleration Library (Intel® ISA-L) Open Source Version in an erasure code aware application environment "Ceph ERASURE CODING AND CACHE TIERING SAMUEL JUST 2015 VAULT" 0 Khan, R C Burns, J S Plank, W Pierce, C Huang FAST, 20, which is incorporated herein by reference in its entirety. Running an application that is erasure code aware gives in hand that the different steps can be divided up between the different hardware and software layers for an optimal functionality. Both the encode and decoding operations can be also be done on distributed compute nodes to offload the heavy weight calculations and also offload rebuild and data traffic from small low power CPU's out on the edge in networks. However, the Reed-Solomon type of erasure codes are not suited for distributed applications when the latency will have severe impact on the performance if one node fails in the RAID and communication with all other nodes over Internet is needed for the data reconstruction. Thus, for distributed storage applications, there is a need for an erasure code that is discrete and not Central Processing Unit (CPU) intensive for the client communicating with the backend storage.

The data input for erasure coding is generated from many different sources and applications and then passed in its full size or as chunks to the input interface of the erasure code for the encoding operations. The input data can be movie files, document files, executables, live video, or any type of data from an application like Microsoft Office documents or from similar type of sources. The data delivered to the input interface will then be transferred into a data matrix that contains the same number of rows as the configuration has as a k data chunks value. The length of the rows are determined by the size of the data delivered to the input interface for the encoding operations or pre-chunked to a specific size either by the application or the erasure code, given by the input configuration settings. The decoder starts to decode the k data chunks row by row and then calculating the m and lr parity chunks determined by the configuration settings for the number of m and lr parity chunks.

When the k data chunks and the m and lr parity chunks are present from the encoder they will be transferred to respective configured backend for safe keeping on separate disks or storage. The backends are normally a single disk but can also be a folder in a filesystem or a storage interface such as for example S3, NFS or a block device such as ISCSI. The most important aspect is that the m and lr parity chunks and k data chunks are separated to have the intended redundancy, not losing all m and k chunks at once during a failure or failures.

After the encoding is done the separate m, lr and k chunks does not contain all information and to be able to reassemble or rebuild and decode the data at least k number of chunks connected to the failure needs to come to the decoder interface of the erasure code to make it possible to start a decoding operation of the data. This aspect that the data is not possible to reassemble from the different backends without k number of chunks, can also be used for data security purposes when the decoding operation needs to have access to multiple backend storage nodes or disks, making it very much more difficult to break into.

The decoding works according to the given settings to reassemble or decode the data and parity chunks delivered to the interface of the decoder. If less than k number of k data chunks are delivered to the decoder interface a decoding operation is necessary, but if k data chunks are delivered a reassemble operation can transfer the k data chunk data into the chosen matrix, and depending on the matrix layout and size, making the decoding using parity chunks unnecessary. If the given settings are set to erasure code aware the reassembly of the data if there is no erasures, will be done directly by the application. The decoded or reassembled data is then transferred to the interface that is the delivery point of the decoding operation. If the data from the start was chunked by the application when this is normal if looking at very big data sizes as for movies or big pictures it is pre-chunked by the application to make the transfer over the network and the different operations more effective. After that all the decoding operations and the reassemble of chunks is done in full the original data is in its original state even if some backend data nodes were lost but within the redundancy of the erasure code configuration.

The proposed technology aims to mitigate at least part of the drawback within the technical field. To this end the proposed technology utilizes a novel version of a Mojette transform (MT) in order to provide a particular representation of the decoded data. The basic Mojette transform is well described in literature. In the following, the term "bin" will be used to denote a projection element in a Mojette transform projection. Briefly, the Mojette transform is a linear discrete exact Radon transform, in other words a set of I discrete projections describing a discrete image f Projection angels are chosen among discrete directions $\varphi_i = \arctan(q_i/p_i)$, where the subscript i takes on integer values and $p_i$ and $q_i$ are relatively prime, i.e., the greatest common divisor is 1, GCD $(p_i, q_i) = 1$. The paper by Pierre Verbert, Vincent Ricordel, Jean-Pierre Guédon. ANALYSIS OF MOJETTE TRANSFORM PROJECTIONS FOR AN EFFICIENT CODING. Workshop on Image Analysis for Multimedia Interactive Services (WIAMIS, April 2004, Lisboa, Portugal. 2004. <hal-00451338>) (Ref 1), which is incorporated herein by reference in its entirety, provides an introduction into how direct and inverse, i.e. encoding and decoding, Mojette transform is done using the direct and inverse algorithms. One great advantage with these algorithms is that they use only addition and subtraction for the encoding and decoding operations, thereby minimizing the CPU constraints for the operations and making the application fast. This paper is incorporated herein by reference in its entirety, and in particular the description of the Mojette transform in section 2, the selection of projections in section 3 and the selection of bins in section 4. A paper by Nicolas Normand, Andrew Kingston, Pierre Évenou. A Geometry Driven Reconstruction Algorithm for the Mojette Transform. Attila Kuba, László G. Nyúl, Kálmán Palágyi. Discrete Geometry for Computer Imagery, October 2006, Szeged, Hungary. Springer Berlin/Heidelberg, 4245, pp.122-133, Lecture Notes in Computer Science. <10.1007/11907350 11>. <hal-00267628> (Ref 2), which is incorporated herein by reference in its entirety, teaches how to use a geometry driven decoding algorithm for the Mojette transform. This the first example for the projections (p,q) p1=(0,1), p2=(1,1), p3=(-1,1) shows that they are well suited for a basic Mojette configuration for storage purposes when this gives a minimum extra data for each calculated projection and has a simple reconstruction pathway. The teachings of this paper is incorporated herein by reference in full, and in particular the description of Mojette transform in section 2 and the geometry driven reconstruction in section 3.

Even though the Mojette transformation operation is well described in the literature, see e.g. the above given references, the relevant definitions and some illustrating examples of the same in order to facilitate the understanding of the proposed technology will be provided. A Mojette transformation is a mathematical operation applied on a two-dimensional representation of data. As used herein it is applied on data blocks in order to obtain an efficient data storage representation of the data. The Mojette transformation may be used as a particular way to encode a data block in order to provide a particular representation of the data block. To this end, the method takes as input specific data that has been given a form that is suitable to encode by means of a Mojette transform, e.g. a data block representation. With data block is here intended a particular sequence of information, i.e. bytes or bits, having a particular size that is commonly denoted block size. Data elements or values forms part of the sequence of the data block, see e.g. the 10×8 data block illustrated in FIG. 2c. When the Mojette transform has been applied to the data block a number of projections are obtained. These projections furnish a particular representation of the original data. A beneficial feature obtained by using the Mojette transform is that it only requires arithmetic operations in the form of additions and subtractions. This will reduce the computational demands of a CPU of a client that accesses data that has been stored in distributed storage.

As was mentioned earlier, the Mojette transform operator or the Mojette projection operator, is applied to a two-dimensional representation of data. Consider the fact that a two-dimensional array, having elements representing certain information carried by the data, can be represented by a discrete function f(k, l) where k and l denotes discrete elements of the array, e.g., pixels or samples. In a two dimensional array these denotes the columns and lines or rows, respectively.

The Mojette transform/projection operator is defined as:

$$M\{f(k,l)\}=\text{proj}(p_i,q_i,a)=\Sigma_{k=0}^{Q-1}\Sigma_{l=0}^{P-1}f(k,l)\delta(a+p_il-q_ik)$$

$$M\{f(k,l)\}=\text{proj}(p_i,q_i,a)=\Sigma_{k=0}^{Q-1}\Sigma_{l=0}^{P-1}f(k,l)\delta(a+p_il-q_ik)$$

The summation indices P and Q correspond to the size of the data block, i.e. the data is given a data block representation of size P×Q, a is a number that will specify the line over which the elements, or pixels, are centered. Applying the Mojette transform operator to a particular data block leads to a sum over the elements or pixels that are centered round a particular line $a=p_il-q_ika=p_il-q_ik$, where the particular line can be inferred from the Kronecker delta function $\delta(a)=1$, $\delta(a)=1$, if $a=0$ and 0 otherwise. In what follows a will be removed from the argument in $\text{proj}(p_i,q_i,a)\text{proj}(p_i,q_i,a)$ and a projection will simply be denoted by $(p_i, q_i)$. The formula (1) above can be used to generate any projection with any value of p and q. The number B of line sums, also referred to as the number of bins, per projection is given by $$B=(Q-1)|p|+(P-1)|q|+1B=(Q-1)|p|+(P-1)|q|+1.$$

Examples of how projections are used in the proposed technology will be illustrated in later sections and examples.

The particular proposed encoding of the data also enables a quick and computationally efficient decoding of the data and also enables a highly efficient reconstruction of faulty data if such data has been detected. Having erasures during decode, less than k erasures will simplify the decoding work. When 1 to k−1 rows are present during decoding operations in an erasure mode, less pixels needs to be calculated and restored using m projections proj(pi, q≠0), making the operations consume less CPU cycles and by this make the decoding operation more performant.

In FIGS. 1a, 1b, 1c, and 1d the proposed technology also provides an apparatus 100 for generating encoded data. The apparatus 100 is configured to obtain data in the form of a data block formatted according to specified settings to comprise rows and columns. The apparatus 100 is also configured to create, by applying an encoding transform on the obtained data block, a set of projections, proj $(p_i, q_i)$, the set comprising a first number of projections, proj $(p_i=1, q_i=0)$, and a second and/or third number of projections, proj $(p_i, q_i\neq0)$, the m and lr number of projections proj $(p_i, q_i\neq0)$ being created by applying an encoding Mojette transform (MT) on the data block. The apparatus 100 is further configured to output the created Mojette projections to enable a storage of the data in the form of the Mojette projections.

An embodiment of the apparatus 100 comprises an apparatus 100 that is configured to create a set of projections, proj $(p_i, q_i)$, by being configured to create the first number of projections, proj $(p_i=1, q_i=0)$, by mapping each row to a corresponding projection, proj $(p_i=1, q_i=0)$, in order to create projections carrying the same information as a corresponding row.

Another embodiment of the apparatus comprises an apparatus 100 that is configured to create a set of projections, proj $(p_i, q_i)$, by being configured to create the m and lr number of projections proj $(p_i, q_i\neq0)$ by applying an encoding Mojette transform on the data block, the m and lr number of projections providing redundancy projections to be used to decode the data block if at least one of the first set of projections contains an erasure or has been erroneously encoded.

FIG. 1a is a schematic block diagram illustrating an example of an apparatus according to the proposed technology. It is shown an apparatus 100 that comprises at least one processor 110 and a memory 120, the memory 120 comprising instructions, which when executed by the at least one processor 110, cause the at least one processor 110 to generate encoded data.

Optionally, the apparatus 100 may also include a communication circuit 130. The communication circuit 130 may include functions for wired and/or wireless communication with other devices in a network. In a particular example, the communication circuit 130 may be based on radio circuitry for communication with one or more other nodes, including transmitting and/or receiving information. Wired communication, i.e. exchange of data over a wired network, is however equally possible. The communication circuit 130 may be interconnected to the processor 110 and/or memory 120. The communication circuit 130 may be interconnected to a hardware circuitry 110. By way of example, the communication circuit 130 may include any of the following: a receiver, a transmitter, a transceiver, input/output (I/O) circuitry, input port(s) and/or output port(s).

The proposed technology also provides an apparatus 200 that is configured to decode data by utilizing a dual decoding mode. The apparatus 200 is configured to acquire settings, the settings comprising a number k of data fragments and a number m and lr of parity fragments, the settings further comprises the block size, packet size, of the encoded data. The apparatus 200 is also configured to obtain encoded data, the encoded data being encoded by applying an encoding Mojette transform on a data block formatted according to the settings, the encoded data comprises a set of Mojette projections, proj $(p_i, q_i)$, the set comprising a first number of projections, proj $(p_i=1, q_i=0)$, and a m and lr number of projections, proj$(p_i, q_i\neq0)$. The apparatus 200 is configured to check whether the first number of projections, proj $(p_i=1, q_i=0)$, is equal to the number k of data fragments. The apparatus 200 is also configured to select, based on the check, a decoding mode to use for decoding the data, the decoding mode being either a no-erasure decoding mode or an erasure decoding mode. The apparatus 200 is further configured to decode the data utilizing the selected decoding mode in order to recreate the data block.

A particular embodiment of the proposed apparatus discloses an apparatus 200 that is configured to select a decoding mode by being configured to select a no-erasure decoding mode if the first number of projections, proj $(p_i=1, q_i=0)$, is equal to the number k of data fragments.

Another embodiment provides for an apparatus 200 that is configured to select a decoding mode by being configured to select an erasure decoding mode if the first number of projections, proj $(p_i=1, q_i=0)$, is less than the number k of data fragments.

Still another embodiment provides an apparatus 200 that is further configured to investigate whether the set of obtained Mojette projections, proj ($p_i$, $q_i$), are enough for decoding the data block.

Yet another embodiment provides an apparatus 200 that is configured to investigate whether the set of obtained Mojette projections, proj ($p_i$, $q_i$), are enough for decoding the data block by being configured to determine whether the obtained first number of projections, proj ($p_i=1$, $q_i=0$), plus the obtained second and/or third number of projections, proj($p_i$, $q_i \neq 0$) is equal to, or larger, than the number of rows of the data block.

According to a particular embodiment of the proposed technology there is provided an apparatus 200 that is configured to request further Mojette projections proj($p_j$,$q_j$) if the obtained first number of projections, proj ($p_i=1$, $q_i=0$), plus the obtained second and/or third number of projections, proj($p_i$, $q_i \neq 0$) is smaller than the number of rows of the data block, the further Mojette projections proj($p_j$,$q_j$) being different from the first number of projections, proj ($p_i=1$, $q_i=0$), and the second and/or third number of projections, proj($p_i$, $q_i \neq 0$).

Another particular embodiment of the proposed technology provides for an apparatus 200 that is configured to decode the data block by using the first number of projections, proj ($p_i=1$, $q_i=0$), the second and/or third number of projections, proj($p_i$, $q_i \neq 0$) and the requested further Mojette projections proj($p_j$,$q_j$).

An optional embodiment of the proposed technology provides an apparatus 200 that is also configured to determine whether the data has been correctly decoded by checking whether the bins of the decoded data is equal to zero.

FIG. 1a also provides a block diagram illustrating a possible embodiment of the proposed apparatus 200. Shown is an apparatus 200 that comprises at least one processor 210 and memory 220, the memory 220 comprising instructions, which when executed by the at least one processor 210, cause the at least one processor 210 to decode data by utilizing a dual decoding mode.

A particular embodiment of the proposed technology also provides an apparatus 200 that comprises a communication circuitry 230 as described earlier.

The proposed methods may also be implemented by means of apparatuses 100; 200 that are based on a hardware circuitry, this is illustrated in FIG. 1b. Particular examples of suitable hardware circuitry include one or more suitably configured or possibly reconfigurable electronic circuitry, e.g. Application Specific Integrated Circuits (ASICs), Field Programmable Gate Arrays (FPGAs), or any other hardware logic such as circuits based on discrete logic gates and/or flip-flops interconnected to perform specialized functions in connection with suitable registers (REG) and/or memory units (MEM).

It is also possible to provide a solution based on a combination of hardware and software. The actual hardware-software partitioning can be decided by a system designer based on a number of factors including processing speed, cost of implementation and other requirements.

Figure 1C:
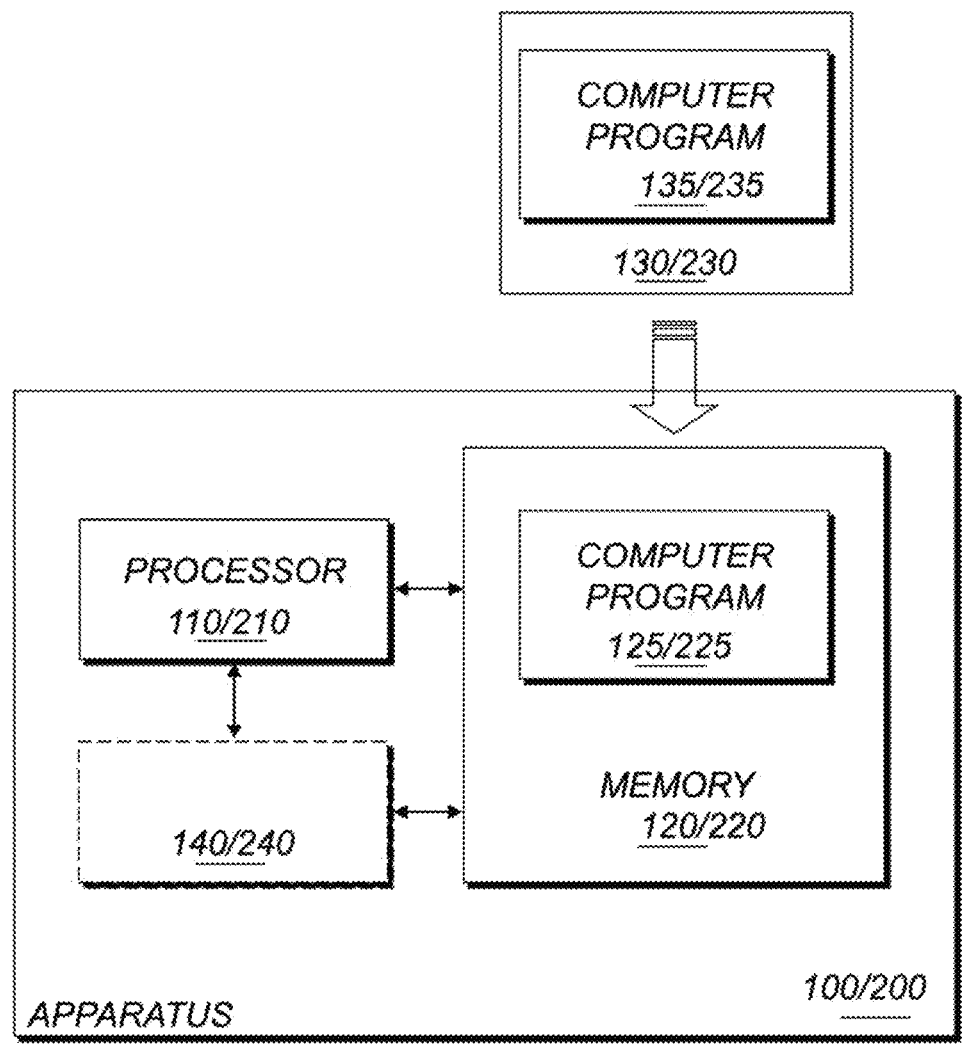
FIG. 1c illustrates another apparatus according to exemplary aspects of the present disclosure.
Figure 1D:
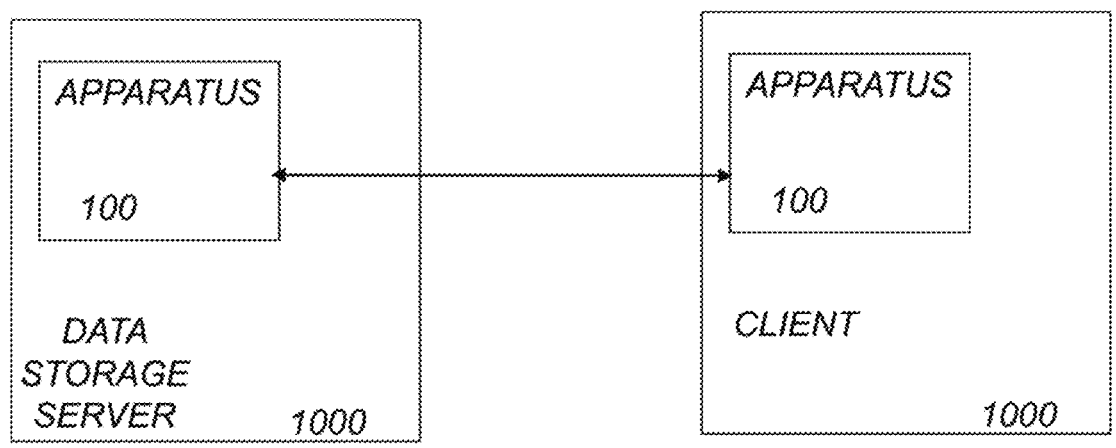
FIG. 1d illustrates a block diagram of a system according to exemplary aspects of the present disclosure

FIG. 1c is a schematic diagram illustrating an example of a computer implementation. In this particular example, at least some of the steps, functions, procedures, modules and/or blocks described herein are implemented in a computer program 125; 135, which is loaded into the memory 120 for execution by processing circuitry including one or more processors 110. The processor(s) 110 and memory 120 are interconnected to each other to enable normal software execution. An optional input/output device 140 may also be interconnected to the processor(s) 110 and/or the memory 120 to enable input and/or output of relevant data such as input parameter(s) and/or resulting output parameter(s). The term 'processor' should be interpreted in a general sense as any system or device capable of executing program code or computer program instructions to perform a particular processing, determining or computing task. The processing circuitry including one or more processors 110 is thus configured to perform, when executing the computer program 125; 135, well-defined processing tasks such as those described herein. The processing circuitry does not have to be dedicated to only execute the above-described steps, functions, procedure and/or blocks, but may also execute other tasks.

It has in particular provided a computer program 125; 135 for generating, when executed, encoded data, wherein the computer program comprises instructions, which when executed by at least one processor, cause the at least one processor to:

read data in the form of a data block formatted according to specified settings to comprise rows and columns;

create, by applying an encoding MT on the obtained data block, a set of projections, proj ($p_i$, $q_i$), the set comprising a first number of projections, proj ($p_i=1$, $q_i=0$), and a multiple/single or combinations of second m and third lr number of projections cobi, proj ($p_i$, $q_i \neq 0$), the second and/or third number of projections proj ($p_i$, $q_i \neq 0$) being created by applying an encoding Mojette transform on the data block obtaining k, m, and lr projections.

output the created Mojette projections to enable a storage of the data in the form of the Mojette projections.

The proposed technology also provides a carrier comprising the computer program 125; 135, wherein the carrier is one of an electronic signal, an optical signal, an electromagnetic signal, a magnetic signal, an electric signal, a radio signal, a microwave signal, or a computer-readable storage medium.

By way of example, the software or computer program 125; 135 may be realized as a computer program product, which is normally carried or stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

Additionally, still referring to FIG. 1c, in one example, at least some of the steps, functions, procedures, modules and/or blocks described herein are implemented in a computer program 225; 235, which is loaded into the memory 220 for execution by processing circuitry including one or more processors 210. The processor(s) 210 and memory 220 are interconnected to each other to enable normal software execution. An optional input/output device 240 may also be interconnected to the processor(s) 210 and/or the memory 220 to enable input and/or output of relevant data such as input parameter(s) and/or resulting output parameter(s). The term 'processor' should be interpreted in a general sense as any system or device capable of executing program code or computer program instructions to perform a particular processing, determining or computing task. The processing circuitry including one or more processors 210 is thus configured to perform, when executing the computer program 225; 235, well-defined processing tasks such as those described herein. The processing circuitry does not have to be dedicated to only execute the above-described steps, functions, procedure and/or blocks, but may also execute other tasks.

It is in particular provided a computer program 225; 235 for decoding, when executed, encoded data by utilizing a dual decoding mode, wherein the computer program comprises instructions, which when executed by at least one processor, cause the at least one processor to:

read settings, the settings comprising a number k of data fragments and a number parity fragments, sub-packetization and partial update, the settings further comprises the block size, packet size, of the encoded data;

read encoded data, the encoded data being encoded by applying an encoding Mojette transform on a data block formatted according to the settings, the encoded data comprises a set of projections, proj $(p_i, q_i)$, the set comprising a first number of projections, proj $(p_i=1, q_i=0)$, and a multiple/single or cobinations of second m and third lr number of projections cobi, proj$(p_i, q_i \neq 0)$;

check whether the first number of projections, proj $(p_i=1, q_i=0)$, is equal to the number k of data fragments;

select, based on the check, a decoding mode to use for decoding the data, the decoding mode being either a no-erasure decoding mode or an erasure decoding mode; and decode the data utilizing the selected decoding mode in order to recreate the data block.

The proposed technology also provides a carrier comprising the computer program 225; 235, wherein the carrier is one of an electronic signal, an optical signal, an electromagnetic signal, a magnetic signal, an electric signal, a radio signal, a microwave signal, or a computer-readable storage medium.

By way of example, the software or computer program 225; 235 may be realized as a computer program product, which is normally carried or stored on a computer-readable medium, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

Figure 1E:
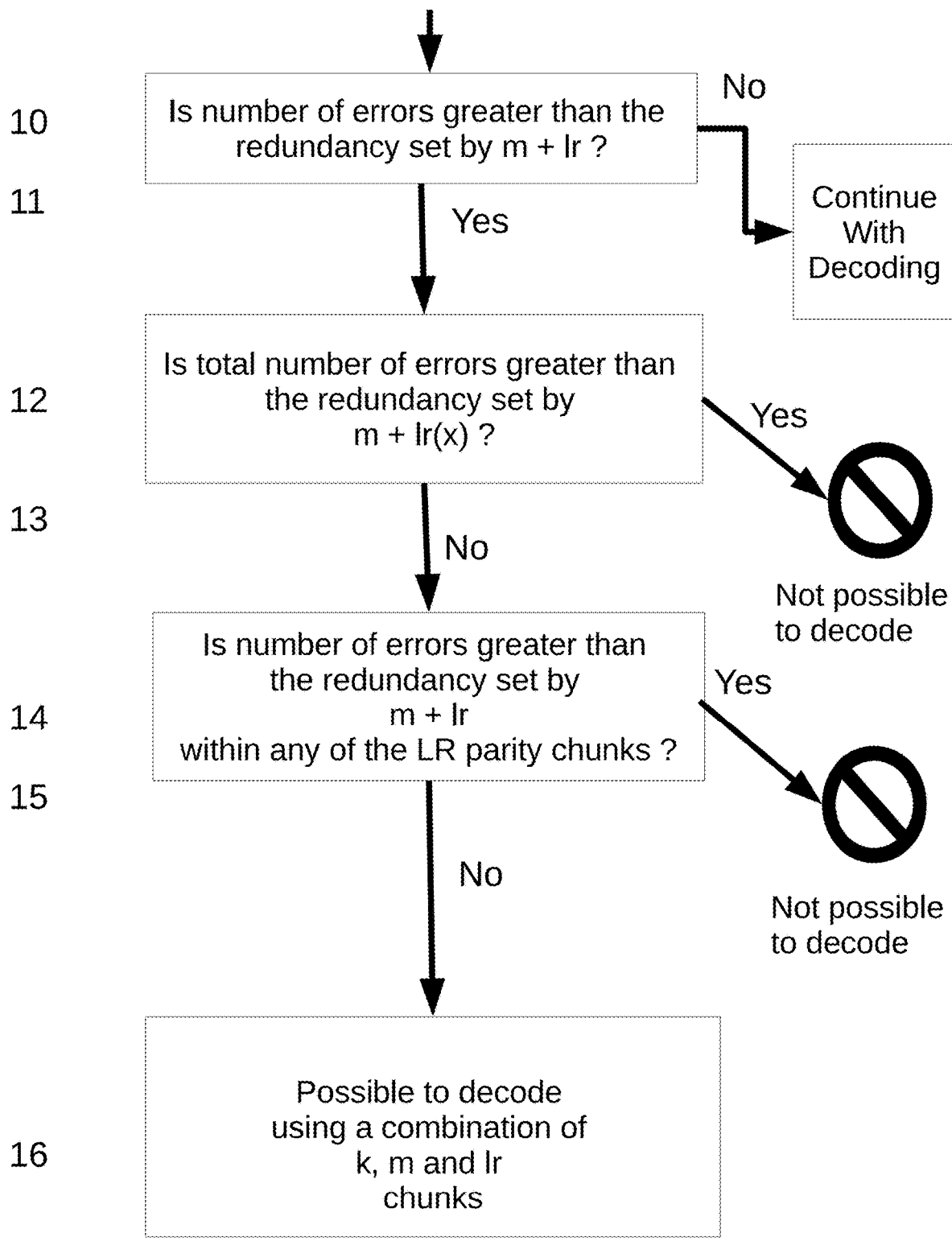
FIG. 1e is a flow diagram illustrating a particular embodiment for decoding a RRE-LR to determine if the amount of failures are decodable according to exemplary aspects of the present disclosure.

A determination can be made to determine whether decoding is possible or decoding is not possible. In FIG. 1e, a flow diagram is representing the possibility to determine if a failure is decodable by the RRE-LR when number of parity chunks and number of failures possible to decode is not equal when the lr parity chunks only sets a redundancy for the associated rows as shown in the general FIG. 2a figure where lr1,1(2,1) is associated with k data chunks one to 4 and lr1,2(2,1) is associated to rows 5 to 8. In step 10 the total number of errors is compared to the number of parity chunks, errors >lr+m, if this is not true then the redundancy is good and the error can be repaired step 11. If the number of errors is greater than lr+m a test must be performed to identify the locations of the error and compared to the parity chunks present. In step 12 the question is if the total number of parity chunks adding each lr sub-parity chunk together with all m chunks is greater than the number of errors, if this is true the failure of the system is too great for the redundancy to repair step 13. In step 14 a test is done to see if the redundancy level for the number of errors is decodable. This is then only true if there is no more than m+lr number of errors within each lr sub-parity chunk. To better explain this in a graphical way is in FIG. 2a to understand that the total number of errors can only be lr+m, in this example three (3). In FIG. 2a going from left to right in the horizontal plane within lr1,1 and adding up all errors for k,lr,m1,m2 and then do the same for lr1,2, if any of these sums then is greater than 3 the error is non-decodable step 15 in FIG. 1. In FIG. 1 step 16, the decode of the error can take place with a combination of lr, m, and k chunks to recover the lost data.

The proposed technology provides particular mechanism for both encoding and decoding data involving a particular application of two types of projections, proj$(p_i=1,q_i=0)$ and proj$(p_i, q_i \neq 0)$. These projections are used in a particular combination in order to achieve a highly robust encoding of the data. The particular proposed encoding of the data also enables a quick and computationally efficient decoding of the data and also enables a highly efficient reconstruction of faulty data if such data has been detected. The proposed technology provides mechanisms whereby the data decoding side can select a particular decoding scheme to use, based on information provided by the encoding side, i.e. by performing a particular check on the encoded data. In what follows the encoding side and the decoding side will be described separately.

According to a first aspect of the proposed technology there is provided a method for generating encoded data. The method comprises the step of obtaining data in the form of a data block formatted according to specified settings to comprise rows and columns. The method also comprises the step of creating, by applying an encoding transform on the obtained data block, a set of projections, proj $(p_i, q_i)$, the set comprising a first number of projections, proj $(p_i=1, q_i=0)$, and a multiple/single or combinations of second m and third lr number of projections cobi, proj $(p_i, q_i \neq 0)$, the second and third number of projections, proj $(p_i, q_i \neq 0)$, being created by applying an encoding Mojette transform on the data block. The method also comprises the step of outputting the created set of projections to enable a storage of the data in the form of the set of projections.

In slightly different words, there is provided a method that generates encoded data, in particular it generates encoded representations of data blocks. The initial, or original form of the data block is provided as input and depends on the particular formatting used. Having obtained the data block the method creates a set of projections by applying an encoding transform on the data block. The encoding transform creates three particular sets of projections k,m,lr. The encoding transform is based on the Mojette transform insofar that projections, proj $(p_i, q_i)$, based on the data block are created. The proposed technology utilizes however a novel application of the Mojette transform in order to generate the first number of projections, proj $(p_i=1, q_i=0)$ while the second and/or third number of projections, proj $(p_i, q_i \neq 0)$, is created by applying a traditional encoding Mojette transform on the data block. The number of second projections, also referred to as redundancy projections or m-projections, or m parity chunks, may be any number that can be obtained by specifying the indices in proj $(p_i, q_i \neq 0)$, e.g. (1, 1), (1, 2), (1, 3), (2, 1), (2, 2) etc. Examples of m-parity chunks are is shown in FIGS. 3a and 3b for the MT projections p(1,1) and p(-1,1).

The number of third projections, also referred to as redundancy projections or lr-projections, or lr parity chunks, may be any number that can be obtained by specifying the indices in proj ($p_i$, $q_i \neq 0$), e.g. (1, 1), (1, 2), (1, 3), (2, 1), (2, 2) etc. Example of lr-parity chunks are is shown in FIG. 3c for the MT projection p(2,1). Hence a large number of redundancy projections may be generated to safeguard the data. The third type of projections is the lr projections shown in a graphical representation in FIG. 2a. The different SBPC within one specific lr parity chunk in FIG. 2a is optimally having the same projection angle to reduce the MT compute operations that needs to be done. These lr parity or redundancy projections are then only connected to specific rows and thereby they can only be used to recover failures connected to these rows. In FIG. 2a $lr_{1,1}$ is a parity chunk for the rows 1 to 4 and $lr_{1,2}$ to rows 5, 6, 7, and 8.

The particular step of creating the first number of projections, proj ($p_i$=1, $q_i$=0), comprises, according to a particular embodiment, a mapping where each row of the data block is mapped to a corresponding projection, proj ($p_i$=1, $q_i$=0). This is done in order to create projections that carries the same information as a corresponding row. Having created the first and second and/or third number of projections the method proceeds and outputs the created set of projections to enable a storage of the data in the form of the set of projections or parity (m or lr) and data chunks. A client accessing the encoded data may now decode the data according to a proposed decoding mechanism to be described later.

The projections, proj ($p_i$=1, $q_i$=0), having q=0 have different properties than projections having q≠0 when they have no information of the rows more than the one it represents. This gives that the proj(1,0) also will be identified as a projection, a q=0-projection is then very similar to a chunk in standard applications containing a header that indicates some parameters for the application like e.g. size or some other entity, which can be used by the application for e.g. identification, and can also be used together with, and fully integrated into, a Mojette transform environment as more traditional projections. These q=0-projections, or data chunk projections, hereby identified as q=0 or proj(1,0) projections, can be treated separately since they do not carry any extra redundancy information like the q≠0 projections do, and they thereby need separate attention with respect to data corruption when used alone, i.e. without any q≠0 projections present during the decoding operation. This is due to the fact that there is no way to verify that the end result is correct without $q_i \neq 0$ projections present. An error with respect to the encoding may be detected by verifying that all bins that have been emptied during the decoding and that each of the bins after the decoding is zero (0), but without the $q_i \neq 0$ projection(s) present during the decoding this is not possible to perform. Having a bin≠0 after decoding will provide an indication that an error has occurred during the encoding of the data and new $q_i \neq 0$ projections will be needed to exchange a faulty projection before the renewed decoding and verification of the decoded data can take place. Moreover, the $q_i$=0 projections also have different properties compared with the $q_i \neq 0$ projections when it comes to computations. The first difference is that the q=0 projections have the original size, i.e. the number of pixels in the q=0 projections have the same number of pixels as the original rows of the data block. They are also less computationally intensive to calculate since a smaller amount of calculations are needed when performing both encoding and decoding. These properties allows for a reduced computational effort during both encoding and decoding operation. The method however also creates a second and third number of projections, proj ($p_i$, $q_i \neq 0$). This may be done by applying an encoding Mojette transform on the data block. The m and lr number of projections provides redundancy projections that can be used to decode the data block if at least one of the first set of projections contains an erasure or has been erroneously encoded. The second and/or third number of projections, with $q_i \neq 0$, may thus be created by applying a traditional Mojette transform on the data block. In the end, the different projections together provide a particular representation of the encoded data that will allow for a highly efficient decoding where erasure of data or erroneously encoded data can be correctly reconstructed swiftly (i.e., with a reduced number of computations).

For the RRE-LR, FIGS. 3a, 3b and 3c illustrates in detail the MT operation on a particular example having 8 rows and 80 pixels, where the proposed encoding procedure is used. Here the MT projections p(1,1), p(−1,1) and p(2,1) are used for the respective m parity chunks and where p(2,1) is used for the two lr parity chunks. The different parity chunks as a result of the above MT operations needs to be stored separately, the m chunks and also the two lr chunks, here in total 4 parity chunks for obtaining optimal redundancy.

FIG. 4a-h is the first example of the RRE-LR MT RRE and uses the FIG. 2c matrix as an example with row 6 and 7 having failed. For the redundancy the parity projections p(−1,1) FIG. 4b and lr1,2(2,1) FIG. 4c will be used to rebuild row 6 and 7.

FIG. 4a shows the initial decoding step where the row 6 and 7 are lost and the parity chunks needs to be used for the MT operation to rebuild the rows. In FIG. 4d the first iteration of the rebuild is completed. The MT operations performed are starting with lr 1,2(2,1) when this has the largest p value for the projection obtaining the pixels 51,52 and 69,70. Then moving to the p(−1,1) projection the MT operation can obtain pixels 58,59,60,61,61,63 giving the status shown in FIG. 4d. FIG. 4e now shows the status of the lr1,2(2,1) and after the MT operations the FIG. 4f shows the result having pixels 53,54,55,66,67,68 regenerated and inserted into the matrix. FIG. 4g now shows the status for the m parity chunk p(−1,1) and after a last MT operation the FIG. 4h status is achieved having all rows recovered and the data possible to assemble for further use in the system. This example shows that RRE-LR based on MT gives a unique possibility to use less data for the rebuild operation compared to use only traditional full matrix m parity chunks making it possible to optimize both computations by less operations and network resources.

FIG. 5a-f is a basic example of RRE-SP sub-packetization for an efficient rebuild operation to reduce network transfers and distribute the compute operations.

FIG. 5a show the initial data matrix having 8 rows and 80 pixels. The configuration from the system has set k=8 and m=2 with projections p(1,1) and p(−1,1) giving FIG. 5b the m projection p(1,1) and FIG. 5c the m projection p(−1,1) and 8 k data chunks. In FIG. 5d it is indicated that one k data chunk or row is missing by a hash sign to be used to illustrate how to reduce the needed information to the final decoding can be achieved using MT operations in combination with distributed nodes in a network.

The decision is to use m parity chunk p(1,1) for the rebuild of the lost k data chunk and the information is sent to the distributed node. FIG. 5e now show the sub-packetization of the remaining 7 k data chunks on a distributed node and the new sub-chunk where the MT operation is performed using the information to base the MT operation on a projection p(1,1). The of the MT operation resulting sub-packetization chunk is sent to the final repair node indicated in FIG. 5f for the final MT operation the recover the lost k data chunk. In FIG. 5f it is shown that doing a MT operation for the difference between m parity chunk p(1,1) and the SP-chunk will obtain the data for the lost data chunk. In this example if all k data chunks where in an of site location this would reduce the amount of network traffic from 7 data chunks to 1 making this very efficient to use RRE-SP based on MT operations for distributed applications with limited network resources are available.

Figures 6B, 6C, 6D:
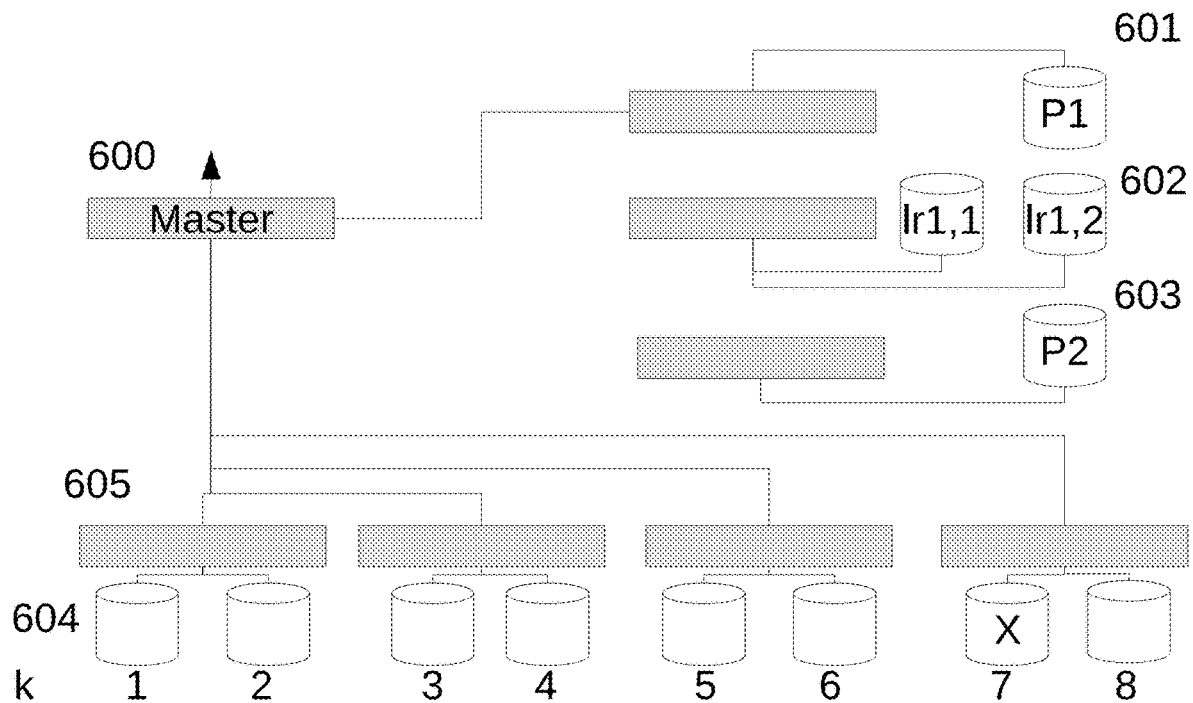
FIG. 6b illustrates the m parity chunk P1 (p(1,1)) to be used for the repair of row 7 according to exemplary aspects of the present disclosure.
FIG. 6c illustrates the final MT operation on the 4 SP-chunks and the P1 parity chunk to repair the failed row 7 using MT and RRE-SP according to exemplary aspects of the present disclosure.
FIG. 6d illustrates a graphical representation for a distributed storage setup where data chunk 7 is failed and repaired after that each data node sends a SP-chunk and parity node sends the parity chunk connected to the lost row to be repaired and MT operation according to exemplary aspects of the present disclosure.

FIG. 6a shows a second example for the RRE-SP where 4 backend nodes receives and performs the sub-packetization of in respective network available k data chunks needed for the rebuild of a lost data chunk or parity chunk. In FIG. 6a the respective MT operations has been performed on the present k data chunks in respective network and in is indicated by hash that row 7 is missing and needs to be repaired. The decision here is made to use m parity chunk p(1,1) for the rebuild and all the sub-packetization backend nodes has calculated the MT operations based on this information shown in FIG. 6a. The SP-chunks from each backend node are sent to the final data node that will also receive the m parity chunk p(1,1) for the final MT operation to rebuild row 7. FIG. 6b shows the MT data for the m parity chunk to be used together with the 4 SP-chunks for the rebuild of the lost row 7. FIG. 6c shows the MT operation performed to obtain de lost row 7 data. The row 7 data now is the difference between m parity chunk p(1,1) and the 4 SP-chunks part-12, part-34, part-56, part-7#8. An overview of a system is shown in FIG. 6d where a master node 600 performs the last repair operation receiving the m parity chunk p(1,1) from node 601 and part-12, part-34, part-56, part-7#8 from respective 605 node that has the respective k data chunk in the network 604 with k=7 marked as lost.

Figure 6E:
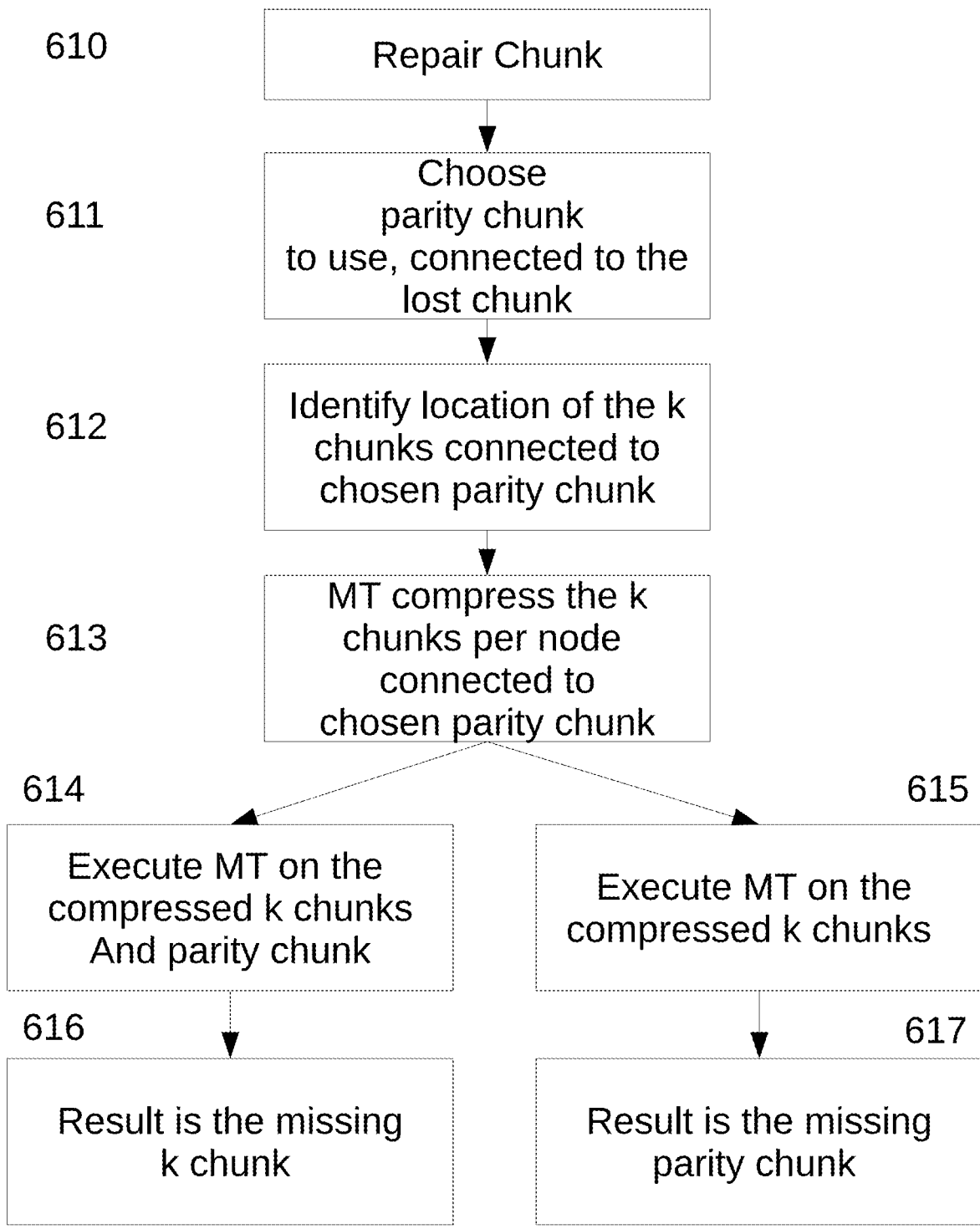
FIG. 6e illustrates a flow diagram for the repair of chunks using MT and RRE-SP according to exemplary aspects of the present disclosure.

FIG. 6e shows a flow diagram of the decisions with respect to the repair step 610 is that a repair of a specific chunk is needed and that this information is distributed to all nodes in the cluster. Step 611 is identification of the parity chunk connected to the failed chunk that will be used for the repair, and if it is only a parity chunk that has failed the connected data chunks. In step 612 the job to the distributed nodes is done identifying where the chunks are located for a sub-packetization to take place. The decision regarding the node for sub-packetization depends on the setup of the distributed network with respect to network capacity and location of the chunks but normally as close as possible to the data chunks to reduce network traffic. Step 613 executes the sub-packetization in accordance with the decision in step 612. Step 613 then splits into two paths depending on if it is k data chunk missing or a m, lr parity chunk. If it is a m or lr parity chunk missing the route is 615 and 617 and for a k data chunk missing 614 and 616.

Figure 6F:
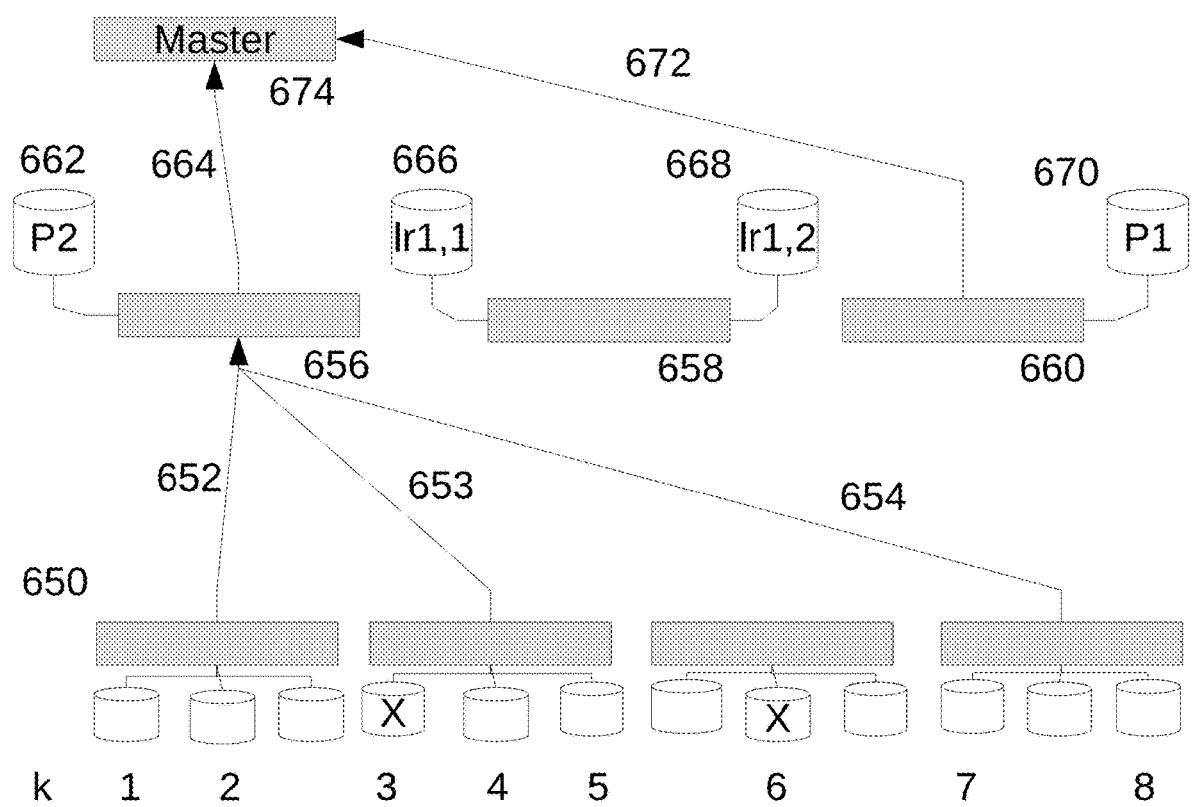
FIG. 6f illustrates a distributed storage example having a three layer setup with data chunks in the lowest nodes and parities in the middle and a master in the top to illustrate the inter node traffic of chunk data during a RRE according to exemplary aspects of the present disclosure.

FIG. 6f is a representation of a distributed storage given here as an example of a distributed system where a multiple repair must take place using RRE-SP based on MT. The distributed storage is set up having a three level hierarchy 650 level 1 656,658,660 for level 2 and 674 for level 3. In the base we have k data chunks and in the second m and lr parity chunks and in the top a master node. The parity chunks are represented by P2 662 lr1,1 666 lr1,2 668 and P1 670 connected to the three nodes in the second level. In the first level having the k data chunks each of the 4 nodes have three k data chunks connected and data chunk 3 and 6 are market with a cross to indicate a failure of these k data chunks. The arrows 652,654,664,672 represents a data flow from a node to another node in the system with SP-chunks and m parity chunks for the RRE-SP operation. In FIG. 6g the first m parity projection to be used for the RRE-SP repair operation is shown having p(1,1) with row3 and row6 marked with hashtags and the projection that will solve this specific row working in this example from left to right and starting with the m parity projections sorted with the P1, when this m projection is the biggest. FIG. 6h shows the P-1 to be used having the projection p(-1,1) also having row3 and row6 marked for repair. FIG. 6i is the first operation performed on level 1 in FIG. 6f MT encoding the present k data chunks present on each node. Here k data chunk 1,2 on one node is RRE-SP MT into a BINs_P1_12 and on the second node BINS_p1_45 is RRE-SP MT decoded and the last node holding k data chunk data the BINS_P1_78 is RRE-SP MT encoded. These RRE-SP chunks are then transported to Node 656 in FIG. 6f using network connection 652, 653, and 654 in FIG. 6f. FIG. 6j is the first in parallel RRE-SP MT operation with FIG. 6i operation performed on level 1 in FIG. 6f MT encoding the present k data chunks present on each node. Here k data chunk 1,2 on one node is RRE-SP MT into a BINS_P-1_12 and on the second node BINS_P-1_45 is RRE-SP MT decoded and the last node holding k data chunk data the BINS_P-1_78 is RRE-SP MT encoded. These RRE-SP chunks are the transported to Node 656 in FIG. 6f using network connection 652, 653 and 654. Node 656 in FIG. 6f now has 6 separate SP_chunks that needs a second RRE-SP MT operation performed on this node. This RRE-SP operation on node 656 is shown in FIGS. 6k and 6l where we get only one RRE-SP chunk per projection P1 SP-Chunk 124578 and P-1 SP-Chunk 124578. These two RRE-SP chunks together with the locally attached P1 is the transported to node 674 for final RRE-SP MT processing. From node 660 in FIG. 6f the m parity projection P1 is transported over network connection 672 to node 674. Present on the master node 674 in FIG. 6f is now 4 chunks, two RRE-SP chunks and two m parity chunks. In FIG. 6m and FIG. 6n this is shown and also the rows that each projection will solve. Row3 will be solved with P1 and Row6 with P-1, and the zeros indicate the data to be decoded and repaired. FIG. 6o and FIG. 6p is a different representation of the RRE-SP chunks only for clarification and to show that some pixels what we now will call free. Free pixels are when in each column for a m parity chunk only one pixel is left to solve. Here in FIG. 6o this can be exemplified with column 3,4, 5 for Row3 making it possible to start RRE-SP MT for these pixels. The RRE-SP MT operation will then be iterative until both rows are rebuilt using the m parity chunks. FIG. 6q to FIG. 6u represents as an example how this RRE-SP MT decoding is performed using PBINS_P1_124578, PBINS_P-1_124578, P1 and P-1 in an iterative process using a MT operation from left to right with P1 solving Row3 and P-1 solving Row6 in 5 iterations starting with P1 and then using P-1 and after each iteration making an update to the PBINS_P1_124578 and PBINS_P-1_124578.

This example will show that the RRE-PU chunk update optimization reduces the number of operations needed when re-encoding parity chunks after an update to one or more data chunks and if data chunks are non-local to the machine performing the re-encode it will also reduce the network traffic since less data chunks need to be transmitted over network. In FIG. 7a RRE-PU data code is represented from A to U. This data will then be used by an application and an update to the data is made only affecting parts of the data code in FIG. 7a. FIG. 7b showing the matrix having k=3 and m=2 with projections p(1,1) and p(2,1) shown in FIG. 7c. In FIG. 7c also the MT operation is performed and the here represented by XOR operations to the data. In FIG. 7d an update of a part of the data is made by a user, here denoted with X and Y. FIG. 7e shows the location of the update in the matrix and that this data is located in row one. FIG. 7f shows after MT operations the new updated projections p(1,1) and p(2,1) with the bins where X and Y is present indicated. In FIG. 7g the difference between row original and updated is show and then in FIG. 7h the difference between the chunks of row one is calculated. In FIG. 7i the difference from FIG. 7h is inserted into the two projections p(1,1) and p(2,1) and the updated difference calculated for the updated bins. In FIG. 7j the final result of the RRE-PU using MT operations is show and the updated bins for each projection is marked.

This example for RRE-PU has shown that the RRE-PU using MT reduces the number of operations needed when re-encoding parity chunks after an update to one or more data chunks. If data chunks are non-local to the machine performing the re-encode it will also reduce the network traffic since less data chunks need to be transmitted over network. The optimization work by patching the parity chunks with the difference between old data chunks and new data chunks. Performance improvements given by the chunk update optimization depends on their size, larger sizes will give larger performance gains using RRE-PU.

According to an optional embodiment the MT and RRE method could be supplemented with a Cyclic Redundancy Check, CRC, performed on the initial or original data block. By ensuring that the initial data block does not contain corrupted data the method whereby the data is subject to the Mojette transform to obtain multiple Mojette transform projections $(p_i, q_i)$ does need to be initiated. So a particular embodiment of the proposed technology also comprises to perform CRC on the initial data and only apply the Mojette transform on the data block if the CRC sum is correct. This will ensure that a client does not need to perform a Mojette decoding on the data if the data is corrupted together with the Mojette transform in order to determine whether data has been corrupted.

According to another embodiment the method could be supplemented with a Streaming SIMD Extensions (SSE) extension for the acceleration of encoding and decoding operations. This embodiment could also be to use programmable hardware devices for the acceleration of the encoding and decoding operation such as field-programmable gate array (FPGA).

Using MT a very efficient SSE accelerated vectorized code can be created that greatly reduces the number of CPU cycles necessary for the decoding process when an erasure is present. In the paper "A Guide to Vectorization with Intel® C++ Compilers" how to generate code for modern CPU's is described that will allow the CPU to fully use the over information in these larger m parity projections for the reduction of CPU cycles. The same is also true for the implementation on FPGA or Graphics Processing Unit (GPU) where even more cores can work in parallel to simultaneous solve the decoding effort when an erasure is present.

Having described the proposed methods in detail, below will follow a description of various apparatuses that are suitable to implement the proposed methods. All of the described advantages and effects achieved by the methods are equally valid for the corresponding apparatuses and will not be described again.

It will be appreciated that the methods and arrangements described herein can be implemented, combined and re-arranged in a variety of ways. For example, embodiments may be implemented in hardware, or in software for execution by suitable processing circuitry, or a combination thereof. The steps, functions, procedures and/or blocks described herein may therefore be implemented in hardware using any conventional technology, such as discrete circuit or integrated circuit technology, including both general-purpose electronic circuitry and application-specific circuitry. Alternatively, or as a complement, at least some of the steps, functions, procedures and/or blocks described herein may be implemented in software such as a computer program for execution by suitable processing circuitry such as one or more processors or processing units. Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. An apparatus comprising:
processing circuitry configured to:
encode data using a Mojette transform based on generating encoded representations of data blocks, wherein the processing circuitry, for generating the encoded representations of data blocks, is further configured to:
read data in the form of a data block formatted according to specified settings to comprise rows and columns,
create a set of projections that includes the processing circuitry further configured to:
apply the Mojette transform on the data block, and create a first number of projections based on mapping each row of the data block to a corresponding projection, the first number of projections including the same information as a corresponding row,
output the created set of projections to enable a storage of the data in the form of the set of projections, and
transmit the encoded data over a network to another device.

2. The apparatus of claim 1, wherein the processing circuitry, for creating the set of projections, is further configured to
create a number of second projections, wherein a number of second projections is any number that can be obtained by specifying the indices in proj $(p_i, q_i \neq 0)$, where proj is projection, p is a row of the projection, and q is a column of the projection.

3. The apparatus of claim 1, wherein the processing circuitry, for creating the set of projections, is further configured to
create a number of third projections, wherein a number of third projections is any number that can be obtained by specifying the indices in proj ($p_i$, $q_i \neq 0$), where proj is projection, p is a row of the projection, and q is a column of the projection.

4. The apparatus of claim 1, wherein the encoded data is generated with one or more reduced repair effort locally recoverable (RRE-LR) codes.

5. The apparatus of claim 4, wherein the RRE-LR codes are configured to produce a set of m, k, lr projections, wherein m is a parity chunk, lr is a parity fragment having sub-block parity chunks (SBPC) from a RRE-LR configuration, and k is a number of chunks.

6. The apparatus of claim 5, wherein the RRE-LR codes, in combination with distributed nodes in the network, are configured to reduced network traffic for a repair.

7. The apparatus of claim 6, wherein a distributed lr projection is configured to reduce one or more of a decoding effort and a repair effort.

8. The apparatus of claim 6, wherein a combination of m, k, lr projections is configured to optimize decoding.

9. The apparatus of claim 1, wherein the processing circuitry is further configured to
repair the data block in response to one or more rows being lost.

10. The apparatus of claim 9, wherein the processing circuitry, for repairing the data block, is further configured to
select a parity chunk one from the set of projections that is connected with the one or more lost rows, the parity chunk being one of a first number of projections, a second number of projections, and a third number of projections,
identify a location of the first number of projections connected to the selected parity chunk, and
compress the first number of projections per node connected to the selected parity chunk by applying the Mojette transform.

11. The apparatus of claim 10, wherein in response to the one or more lost rows being from the first number of projections, the processing circuitry, for repairing the data block, is further configured to
apply the Mojette transform to the compressed first number of projections and the selected parity chunk, and
generate the one or more lost rows, wherein the one or more lost rows correspond to one or more of the first number of projections.

12. The apparatus of claim 10, wherein in response to the one or more lost rows being from the second or third number of projections, the processing circuitry, for repairing the data block, is further configured to
apply the Mojette transform to the compressed first number of projections, and
generate the one or more lost rows, wherein the one or more lost rows correspond to a missing parity chunk.

13. The apparatus of claim 1, wherein one or more reduced repair effort-sub-packetization (RRE-SP) codes are configured to reduce an amount of data required for a final decoding using distributed Mojette transform operations.

14. The apparatus of claim 13, wherein the one or more RRE-SP codes, in combination with distributed nodes in the network, are configured to reduce network traffic for a repair.

15. The apparatus of claim 14, wherein a distributed lr projection is configured to reduce one or more of a decoding effort and a repair effort.

16. The apparatus of claim 1, wherein one or more reduced repair effort-Partial Update (RRE-PU) codes are configured to reduce a number of operations for a partial update using distributed Mojette transform operations.

17. The apparatus of claim 16, wherein the one or more RRE-PU codes, in combination with distributed nodes in the network, are configured to reduce network traffic.

18. A method for generating encoded representations of data blocks, comprising:
encoding, via processing circuitry, data using a Mojette transform based on generating encoded representations of data blocks, wherein generating encoded representations of data blocks includes
reading, via the processing circuitry, data in the form of a data block formatted according to specified settings to comprise rows and columns;
creating, via the processing circuitry, a set of projections, the creating including:
applying a Mojette transform on the data block; and
creating a first number of projections based on mapping each row of the data block to a corresponding projection, wherein the first number of projections carry the same information as a corresponding row; and
outputting, via the processing circuitry, the created set of projections to enable a storage of the data in the form of the set of projections.

19. The method of claim 18, wherein the creating the set of projections includes
creating a number of second projections, wherein the number of second projections is any number that can be obtained by specifying the indices in proj ($p_i$, $q_i \neq 0$), where proj is projection, p is a row of the projection, and q is a column of the projection.

20. The method of claim 18, wherein the creating the set of projections further includes
creating a number of third projections, wherein the number of third projections is any number that can be obtained by specifying the indices in proj ($p_i$, $q_i \neq 0$), where proj is projection, p is a row of the projection, and q is a column of the projection.

21. The method of claim 18, wherein the encoded data is generated with one or more reduced repair effort-locally recoverable (RRE-LR) codes.

22. The method of claim 18, further comprising:
repairing the data block in response to one or more rows being lost.

23. The method of claim 22, wherein the repairing the data block includes
selecting a parity chunk one from the set of projections that is connected with the one or more lost rows, the parity chunk being one of a first number of projections, a second number of projections, and a third number of projections;
identifying a location of the first number of projections connected to the selected parity chunk; and
compressing the first number of projections per node connected to the selected parity chunk by applying the Mojette transform.

24. The method of claim 23, wherein in response to the one or more lost rows being from the first number of projections, the repairing the data block includes
applying the Mojette transform to the compressed first number of projections and the selected parity chunk; and
generating the one or more lost rows, wherein the one or more lost rows correspond to one or more of the first number of projections.

25. The method of claim 23, wherein in response to the one or more lost rows being from the second or third number of projections, the repairing the data block includes applying the Mojette transform to the compressed first number of projections; and generating the one or more lost rows, wherein the one or more lost rows correspond to a missing parity chunk.

26. An apparatus comprising:

circuitry configured to receive encoded data from another device, determine whether the encoded data is decodable, wherein a determination whether the encoded data is decodable is performed by the circuitry being configured to compare a total number of errors to a predetermined number of parity chunks, wherein the comparison includes determining whether the total number of errors is greater than m+lr, whether the total number of errors is not greater than m+lr(x), and whether the total number of errors is greater than a redundancy set by m+lr within any of the lr parity chunks, where m is a parity chunk, lr is a parity fragment having sub-block parity chunks (SBPC) from a reduced repair effort—locally recoverable codes (RRE-LR) configuration, and lr(x) is all lr sub-parity chunks, and in response to the total number of errors being greater than to m+lr and the total number of errors not being greater than m+lr(x), the encoded data is determined to be decodable, and decode the encoded data using a Mojette transform (MT) and one or more RRE-LR codes.

* * * * *